US011323727B2

(12) United States Patent
Hui et al.

(10) Patent No.: US 11,323,727 B2
(45) Date of Patent: May 3, 2022

(54) ALTERATION OF SUCCESSIVE CANCELLATION ORDER IN DECODING OF POLAR CODES

(71) Applicant: Telefonaktiebolaget LM Ericsson (publ), Stockholm (SE)

(72) Inventors: Dennis Hui, Sunnyvale, CA (US); Yufei Blankenship, Kildeer, IL (US)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 277 days.

(21) Appl. No.: 16/483,503

(22) PCT Filed: Feb. 5, 2018

(86) PCT No.: PCT/IB2018/050719
§ 371 (c)(1),
(2) Date: Aug. 5, 2019

(87) PCT Pub. No.: WO2018/142367
PCT Pub. Date: Aug. 9, 2018

(65) Prior Publication Data
US 2021/0021844 A1 Jan. 21, 2021

Related U.S. Application Data

(60) Provisional application No. 62/455,322, filed on Feb. 6, 2017.

(51) Int. Cl.
*H04N 5/225* (2006.01)
*H04N 19/189* (2014.01)
*H04N 19/50* (2014.01)
(52) U.S. Cl.
CPC ........... *H04N 19/189* (2014.11); *H04N 19/50* (2014.11)

(58) Field of Classification Search
CPC .................................................... H04N 19/189
(Continued)

(56) References Cited

U.S. PATENT DOCUMENTS

2013/0117344 A1* 5/2013 Gross ................ H03M 13/1575
708/490
2016/0013887 A1* 1/2016 Shen ..................... H04L 1/0041
375/295

(Continued)

FOREIGN PATENT DOCUMENTS

EP 2953307 A1 12/2015

OTHER PUBLICATIONS

Arikan, Erdal, "Channel Polarization: A Method for Constructing Capacity-Achieving Codes for Symmetric Binary-Input Memoryless Channels," IEEE Transactions on Information Theory, vol. 55, No. 7, Jul. 2009, pp. 3051-3073.

(Continued)

*Primary Examiner* — Yulin Sun
(74) *Attorney, Agent, or Firm* — Sage Patent Group

(57) ABSTRACT

Systems and methods for performing polar decoding using a transformation of the coded bits prior to polar decoding and an inverse transformation of the resulting data bits after polar decoding are disclosed. In some embodiments, a method of operation of a receiving node to perform polar decoding comprises transforming a received code bit vector $y_N$ in accordance with a transformation $T_N$ to thereby provide a transformed code bit vector $Y'_N = Y_N T_N$, performing polar decoding of the transformed code bit vector $y'_N$ to (Continued)

Example of polar code structure with N = 8 thereby provide a transformed data bit vector $v'_N$, and inversely transforming the transformed data bit vector $v'_N$ in accordance with an inverse transformation $T_N^{-1}$ to thereby provide an estimated data bit vector $v_N = v'_N T_N^{-1}$. In some embodiments, the transformation $T_N$ re-orders coded bits in the coded bit vector $y_N$ such that some future frozen bit(s) are swapped in front of some information bit(s) prior to performing polar decoding.

25 Claims, 14 Drawing Sheets

(58) Field of Classification Search
USPC .......................................................... 386/244
See application file for complete search history.

(56) References Cited

U.S. PATENT DOCUMENTS

| | | | |
|---|---|---|---|
| 2016/0294418 A1* | 10/2016 | Huang | H03M 13/13 |
| 2017/0222757 A1* | 8/2017 | Huang | H03M 13/13 |
| 2018/0249160 A1* | 8/2018 | Zhao | H04N 19/91 |

OTHER PUBLICATIONS

Bioglio, Valerio, et al., "Low-Complexity Puncturing and Shortening of Polar Codes," IEEE Wireless Communications and Networking Conference Workshops (WCNCW), San Francisco, CA, 2017, pp. 1-6.

Hussami, Nadine, et al., "Performance of Polar Codes for Channel and Source Coding," IEEE International Symposium on Information Theory, Seoul, 2009, pp. 1488-1492.

Reddy L., Bharath Kumar, et al., "A GPU implementation of Belief Propagation decoder for Polar Codes," Forty Sixth Asilomar Conference on Signals, Systems and Computers (ASILOMAR), Pacific Grove, CA, 2012, pp. 1272-1276.

Sarkis, Gabi, et al., "Fast Polar Decoders: Algorithm and Implementation," IEEE Journal on Selected Areas in Communications, vol. 32, No. 5, May 2014, pp. 946-957.

Tal, Ido, et al., "List Decoding of Polar Codes," IEEE International Symposium on Information Theory Proceedings, St. Petersburg, 2011, pp. 1-5.

Vangala, Harish, et al., "A New Multiple Folded Successive Cancellation Decoder for Polar Codes," IEEE Information Theory Workshop (ITW 2014), Hobart, TAS, 2014, pp. 381-385.

International Search Report and Written Opinion for International Patent Application No. PCT/IB2018/050719, dated May 9, 2018, 21 pages.

* cited by examiner

Example of polar code structure with N = 8

Polar code encoder with N = 8

*Butterfly-based SC decoder with N = 8*

Illustration of encoding process of polar code with transformation

Illustration of decoding process of polar code with transformation

Illustration of decomposing a polar code of length 16 into 2 polar codes of length 8, or into 8 polar codes of length 2

Illustration of decomposing a polar code of length 16 into 3 polar codes of length 4, 4, and 8, respectively, according to a possibly-variable-length prefix-free code c = {1,00,01}

Illustration of decomposing a polar code of length 16 into 2 overlaping polar codes of length 4 and 8, respectively, according to a possibly-variable-length code c = {1,00,01}

ALTERATION OF SUCCESSIVE CANCELLATION ORDER IN DECODING OF POLAR CODES

RELATED APPLICATIONS

This application is a 35 U.S.C. § 371 national phase filing of International Application No. PCT/IB2018/050719, filed Feb. 5, 2018, which claims the benefit of provisional patent application Ser. No. 62/455,322, filed Feb. 6, 2017, the disclosures of which are hereby incorporated herein by reference in their entireties.

TECHNICAL FIELD

Polar codes, Cyclic Redundancy Check (CRC), error detection

BACKGROUND

Polar codes, proposed by Arikan [1], are the first class of constructive coding schemes that are provable to achieve the symmetric capacity of the binary-input discrete memoryless channels under a low-complexity Successive Cancellation (SC) decoder. However, the finite-length performance of polar codes under SC is not competitive compared to other modern channel coding schemes such as Low-Density Parity-Check (LDPC) codes and Turbo codes. Later, a SC List (SCL) decoder is proposed in [2], which can approach the performance of an optimal Maximum-Likelihood (ML) decoder. By concatenating a simple Cyclic Redundancy Check (CRC) coding, it was shown that the performance of concatenated polar code is competitive with that of well-optimized LDPC and Turbo codes. As a result, polar codes are being considered as a candidate for future Fifth Generation (5G) wireless communication systems.

The main idea of polar coding is to transform a pair of identical binary-input channels into two distinct channels of different qualities, one better and one worse than the original binary-input channel. By repeating such a pair-wise polarizing operation on a set of $2^M$ independent uses of a binary-input channel, a set of $2^M$ "bit-channels" of varying qualities can be obtained. Some of these bit channels are nearly perfect (i.e., error free) while the rest of them are nearly useless (i.e., totally noisy). The point is to use the nearly perfect channel to transmit data to the receiver while setting the input to the useless channels to have fixed or frozen values (e.g., 0) known to the receiver. For this reason, those input bits to the nearly useless and the nearly perfect channel are commonly referred to as frozen bits and non-frozen (or information) bits, respectively. Only the non-frozen bits are used to carry data in a polar code. An illustration of the structure of a length 8 polar code is illustrated in FIG. 1.

FIG. 2 illustrates the labeling of the intermediate information bits $s_{l,i}$, where $l \in \{0, 1, \ldots, n\}$ and $i \in \{0, 1, \ldots, N-1\}$ during polar encoding with $N=8$. The intermediate information bits are related by the following equation:

$$s_{l+1,i} = s_{l,i} \oplus s_{l,i+2^l}, \text{ if } \mathrm{mod}\left(\left\lfloor \frac{i}{2^l} \right\rfloor, 2\right) = 0,$$

$$s_{l+1,i} = s_{l,i}, \text{ if } \mathrm{mod}\left(\left\lfloor \frac{i}{2^l} \right\rfloor, 2\right) = 1$$

for $i \in \{0, 1, \ldots, N-1\}$ and $l \in \{0, 1, \ldots, n-1\}$, with $s_{0,i} = u_i$ being the information bits, and $s_{n,i} = x_i$ being the code bits, for $i \in \{0, 1, \ldots, N-1\}$.

In this discussion, we assume a butterfly based decoder as illustrated in FIG. 3 for the case of $N=8$. Messages passed in the decoder are Log-Likelihood Ratio (LLR) values denoted as $L_{l,i}$, where l and i correspond to the graph stage index and row index, respectively. In addition, $L_{n,i}$ is the LLR directly calculated from the channel output $y_i$. The basic components of the decoder are two functions given by:

$$L_{l-1,i} = f(L_{l,i}, L_{l,i+2^l}) \triangleq \Delta 2\tanh^{-1}(\tanh(L_{l,i}/2)\tanh(L_{l,i+2^l}/2)) \quad \text{if } B(l, i) = 0$$

$$L_{l-1,i} = g(\hat{s}_{l,i-2^l}, L_{l,i}, L_{l,i-2^l}) \triangleq (-1)^{\hat{s}_{l,i-2^l}} L_{l,i-2^l} + L_{l,i} \quad \text{if } B(l, i) = 1$$

for $l \in \{0, 1, \ldots, n-1\}$ and $i \in \{0, 1, \ldots, N-1\}$, where $B(l, i)$ denotes the lth significant bit in the binary representation of i, and where $\hat{s}_{l,i}$ denotes an estimate of the intermediate information bit $s_{l,i}$.

SUMMARY

Systems and methods for performing polar decoding using a transformation of the coded bits prior to polar decoding and an inverse transformation of the resulting data bits after polar decoding are disclosed. In some embodiments, a method of operation of a receiving node to perform polar decoding comprises transforming a received code bit vector $y_N$ in accordance with a transformation $T_N$ to thereby provide a transformed code bit vector $y_N' = y_N T_N$, performing polar decoding of the transformed code bit vector $y_N'$ to thereby provide a transformed data bit vector $v_N'$, and inversely transforming the transformed data bit vector $v_N'$ in accordance with an inverse transformation $T_N^{-1}$ to thereby provide an estimated data bit vector $v_N = v_N' T_N^{-1}$. In some embodiments, the transformation $T_N$ re-orders coded bits in the coded bit vector $y_N$ such that some future frozen bit(s) are swapped in front of some information bit(s) prior to performing polar decoding. As a result, conventional successive decoding based on a natural ordering can be used while taking into account those future frozen bit(s) that would otherwise be ignored by conventional Successive Cancellation (SC) or SC List (SCL) polar decoders. By doing do, decoding performance can be enhanced without the need of increasing decoding complexity, e.g., through an increased list size of a SCL decoder.

In some embodiments, the transformation $T_N$ satisfies:

$$G_N = T_N G_N T_N^{-1}$$

where $G_N$ is a polar generating matrix of length N. Further, in some embodiments, the transformation $T_N$ is a bit-reversal matrix $R_N$ that performs permutation in such a way that $e_i R_N = e_{r(i)}$, for all $i \in \{0, 1, 2, \ldots, N-1\}$, where $e_i$ denotes a vector with all zeros except at the ith position where the element is one, and where $r(i) \in \{0, 1, 2, \ldots, N-1\}$ denotes a number whose binary representation is in a reversed bit order as the binary representation of the number i. In some embodiments, the transformation $T_N$ is a bit-reversal matrix $R_N$ that performs permutation in such a way that an order of the bits in a binary representation of indices that address elements in the received code bit vector $y_N$ is reversed to provide the transformed code bit vector $y_N'$. In some embodiments, the transformation $T_N$ is a last-to-first permutation matrix $F_N$ of the following form:

$$F_N = \left[ I_{N/2} \otimes \begin{bmatrix} 1 \\ 0 \end{bmatrix} \middle| I_{N/2} \otimes \begin{bmatrix} 0 \\ 1 \end{bmatrix} \right]$$

where $I_{N/2}$ is the (N/2)×(N/2) identity matrix. In some embodiments, the transformation $T_N$ is a last-to-first permutation matrix $F_N$ that performs permutation in such a way that a last bit in a binary representation of indices that address elements of the received code bit vector $y_N$ becomes a first bit in a binary representation of indices that address elements of the transformed code bit vector $y_N'$. In some embodiments, the transformation $T_N$ is an any-bit-to-any-bit permutation matrix $A_{M,N}$ of the following form:

$$A_{M,N} = F_M \otimes I_{\frac{N}{M}}$$

for any M that is a power of 2 and is no larger than N. In some embodiments, the transformation $T_N$ is an any-bit-to-any-bit permutation matrix $A_{M,N}$ that performs permutation in such a way that a bit at a first bit location in a binary representation of indices that address elements of the received code bit vector $y_N$ becomes a bit at a second bit location in a binary representation of indices that address elements of the transformed code bit vector $y_N'$, wherein the first bit location is different than the second bit location. In some embodiments, the transformation $T_N$ is an arbitrary bit permutation matrix $S_{\mu,N}$ of the following form:

$$S_{\mu,N} \triangleq A_{M_1,N} A_{M_1,N} A_{M_2,N} \ldots A_{M_{\log_2 N},N} \text{ where } \{M_{i,N}\}_{i=1}^{\log_2 N}$$

can be chosen one-by-one such that the μ(i)-th bit is in the i-th position in the final permuted binary representation. In some embodiments, the transformation $T_N$ is an arbitrary bit permutation matrix $S_{\mu,N}$ that performs multiple any-bit-to-most-significant bit permutations on bits in a binary representation of indices that address elements of the received code bit vector $y_N$ to provide the transformed code bit vector $y_N'$.

In some embodiments, performing polar decoding of the transformed code bit vector $y_N'$ comprises performing SC decoding of the transformed code bit vector $y_N'$ to thereby provide the transformed data bit vector $v_N'$.

In some embodiments, performing polar decoding of the transformed code bit vector $y_N$ comprises performing SCL decoding of the transformed code bit vector $y_N$ to thereby provide the transformed data bit vector $v_N'$.

In some embodiments, the received code bit vector $y_N$ is a vector of Log-Likelihood Ratios (LLRs). In some embodiments, transforming the received code bit vector $y_N$ in accordance with the transformation $T_N$ comprises transforming the vector of LLRs in accordance with the transformation $T_N$ to thereby provide the transformed data bit vector $v_N'$, and performing polar decoding of the transformed code bit vector $y_N'$ comprises performing SC or SCL decoding of the transformed code bit vector $y_N'$ based on a natural ordering of bit indices for the transformed code bit vector $y_N'$ to thereby provide the transformed data bit vector $v_N'$. In some embodiments, the method further comprises extracting an output information bit vector from the transformed data bit vector $v_N'$ according to an original information set for the received code bit vector $y_N$, wherein the original information set for the received code bit vector $y_N$ defines which bits of the received code bit vector $y_N$ are information bits and which bits of the received code bit vector $y_N$ are frozen bits.

In some embodiments, the method further comprises extracting information bits, as opposed to frozen bits, from the estimated data bit vector $V_N$.

In some embodiments, the method further comprises performing the steps of transforming, decoding, and inversely transforming for each of a plurality of independent component polar codes having respective lengths that are less than N according to a prefix-free code $C=\{b_1, b_2, \ldots, B_Q\}$ of which each codeword $b_i$ has a maximum length of N bits, where Q is an integer no larger than $(\log_2 N)-2$, and wherein a prefix-free code is a code where no codeword is a prefix of another codeword. In some embodiments, the transformation $T_N$ is not the same for all of the plurality of independent component polar codes.

In some embodiments, the method further comprises performing the steps of transforming, decoding, and inversely transforming for each of a plurality of different transformations $T_N$ to thereby provide a plurality of estimated data bit vectors. In some embodiments, the method further comprises selecting a best estimated data bit vector from among the plurality of estimated data bit vectors output based on the plurality of different transformations $T_N$ as a final estimated data bit vector. In some embodiments, selecting the best estimated data bit vector comprises selecting the best estimated data bit vector from among the plurality of estimated data bit vectors output based on the plurality of different transformations $T_N$ based on one or more criteria comprising at least one of a path metric magnitude, a Cyclic Redundancy Check (CRC) checksum, and a parity-checksum.

In some embodiments, the method further comprises performing the steps of transforming, decoding, and inversely transforming for each of a plurality of independent component polar codes having respective lengths that are less than N according to a code $C=\{b_1, b_2, \ldots, b_Q\}$ of which each codeword $b_i$ has a maximum length of N bits, where Q is an integer no larger than $(\log_2 N)-2$. In some embodiments, the transformation $T_N$ is not the same for all of the plurality of independent component polar codes.

Embodiments of a receiving node are also disclosed. In some embodiments, a receiving node operable to perform polar decoding is adapted to transform a received code bit vector $y_N$ in accordance with a transformation $T_N$ to thereby provide a transformed code bit vector $y_N'=y_N T_N$, perform polar decoding of the transformed code bit vector $y_N'$ to thereby provide a transformed data bit vector $v_N'$, and inversely transform the transformed data bit vector $v_N'$ in accordance with an inverse transformation $T_N^{-1}$ to thereby provide an estimated data bit vector $v_N = v_N' T_N^{-1}$.

In some embodiments, a receiving node operable to perform polar decoding comprises at least one receiver and processing circuitry adapted to transform a received code bit vector $y_N$ in accordance with a transformation $T_N$ to thereby provide a transformed code bit vector $y_N'=y_N T_N$, perform polar decoding of the transformed code bit vector $y_N'$ to thereby provide a transformed data bit vector $v_N'$, and inversely transform the transformed data bit vector $v_N'$ in accordance with an inverse transformation $T_N^{-1}$ to thereby provide an estimated data bit vector $v_N = v_N' T_N^{-1}$.

In some embodiments, a receiving node operable to perform polar decoding comprises a plurality of modules comprising a transforming module operable to transform a received code bit vector $y_N$ in accordance with a transformation $T_N$ to thereby provide a transformed code bit vector $y_N' = y_N T_N$, a performing module operable to perform polar decoding of the transformed code bit vector $y_N'$ to thereby provide a transformed data bit vector $v_N'$, and an inverse transforming module operable to inversely transform the transformed data bit vector $v_N'$ in accordance with an inverse transformation $T_N^{-1}$ to thereby provide an estimated data bit vector $v_N = v_N' T_N^{-1}$.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
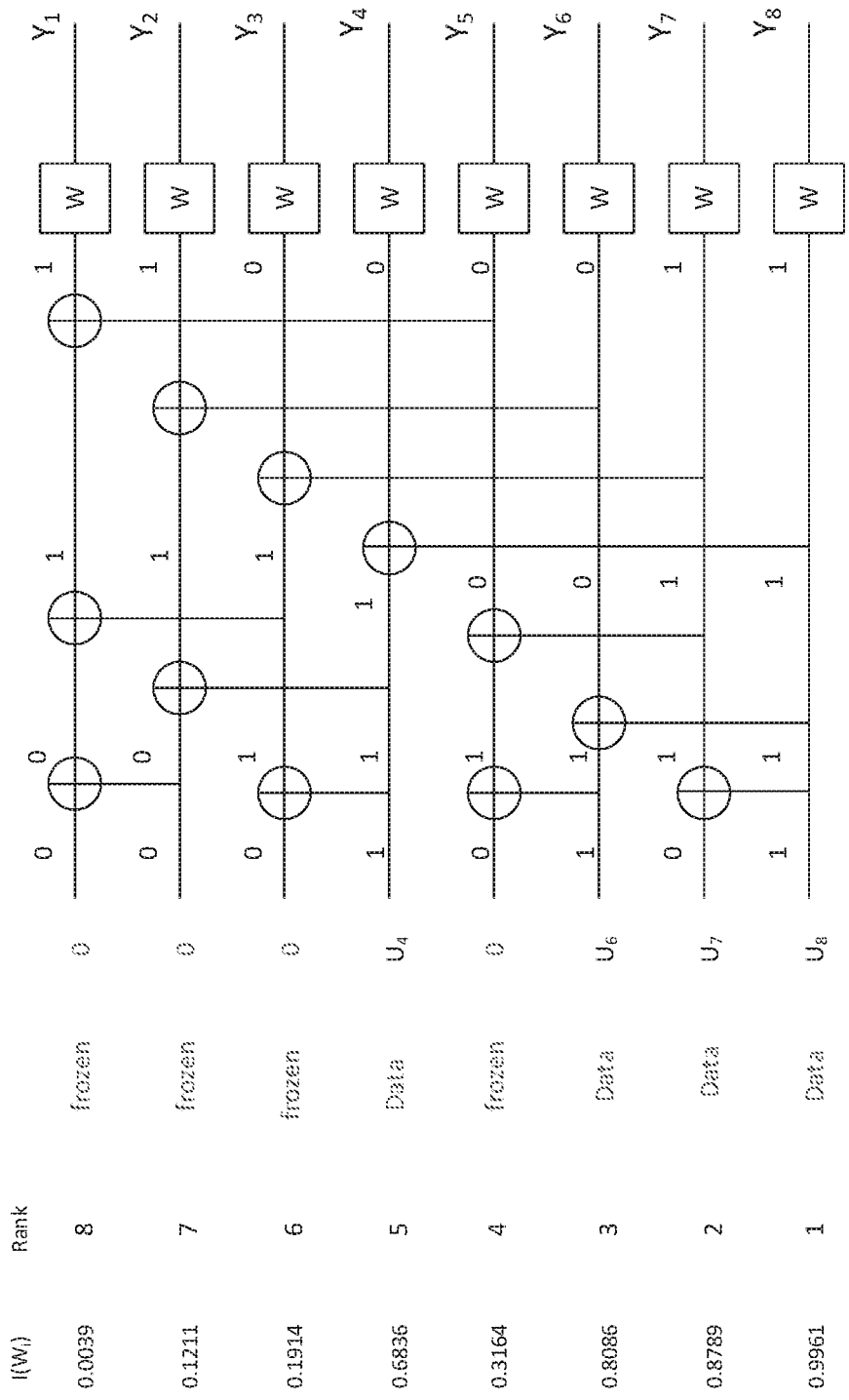
FIG. 1 is an illustration of the structure of a length 8 polar code.
Figure 2:
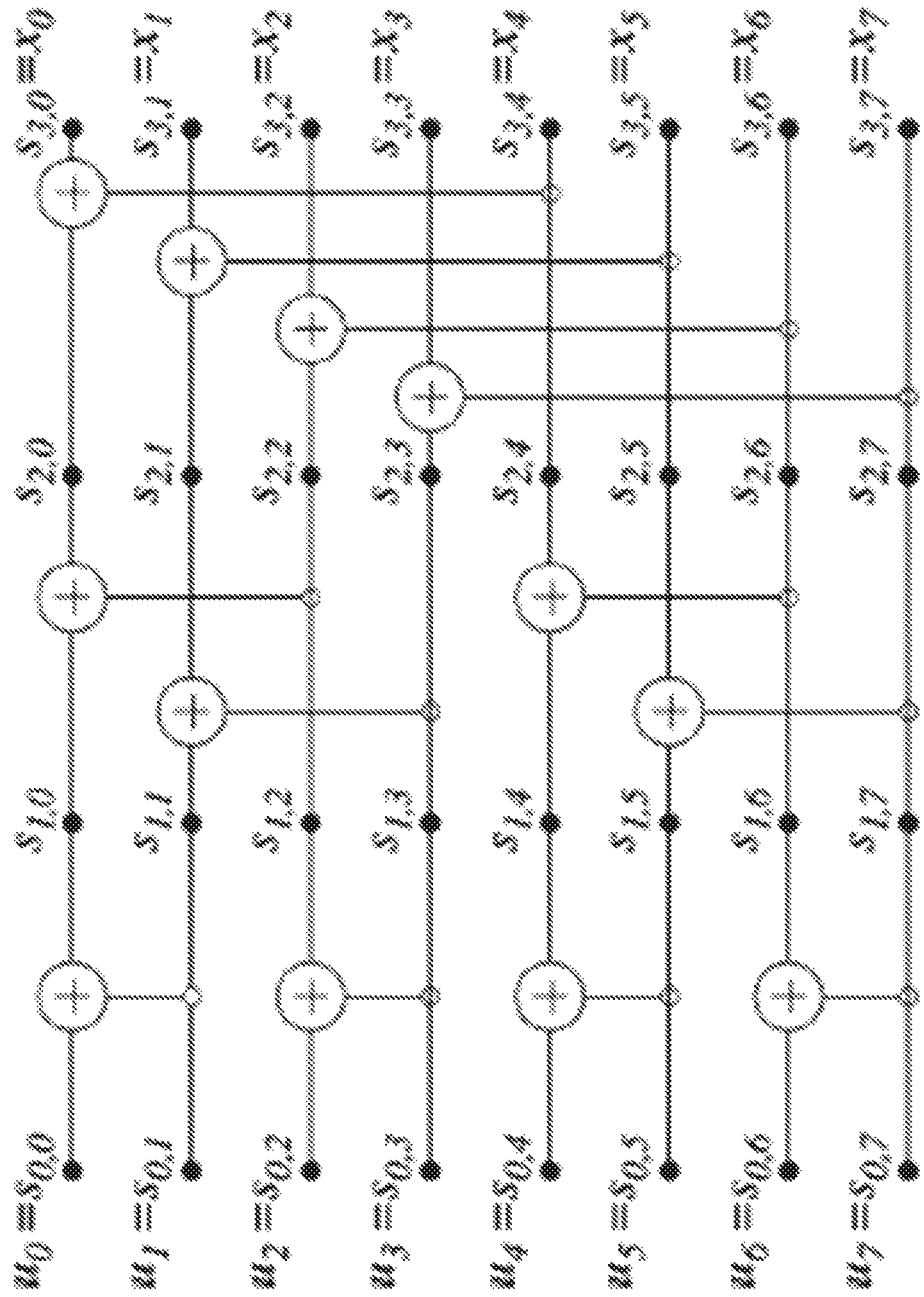
FIG. 2 illustrates the labeling of the intermediate information bits $s_{l,i}$, where $l \in \{0, 1, \ldots, n\}$ and $i \in \{0, 1, \ldots, N-1\}$ during polar encoding with $N=8$.
Figure 3:
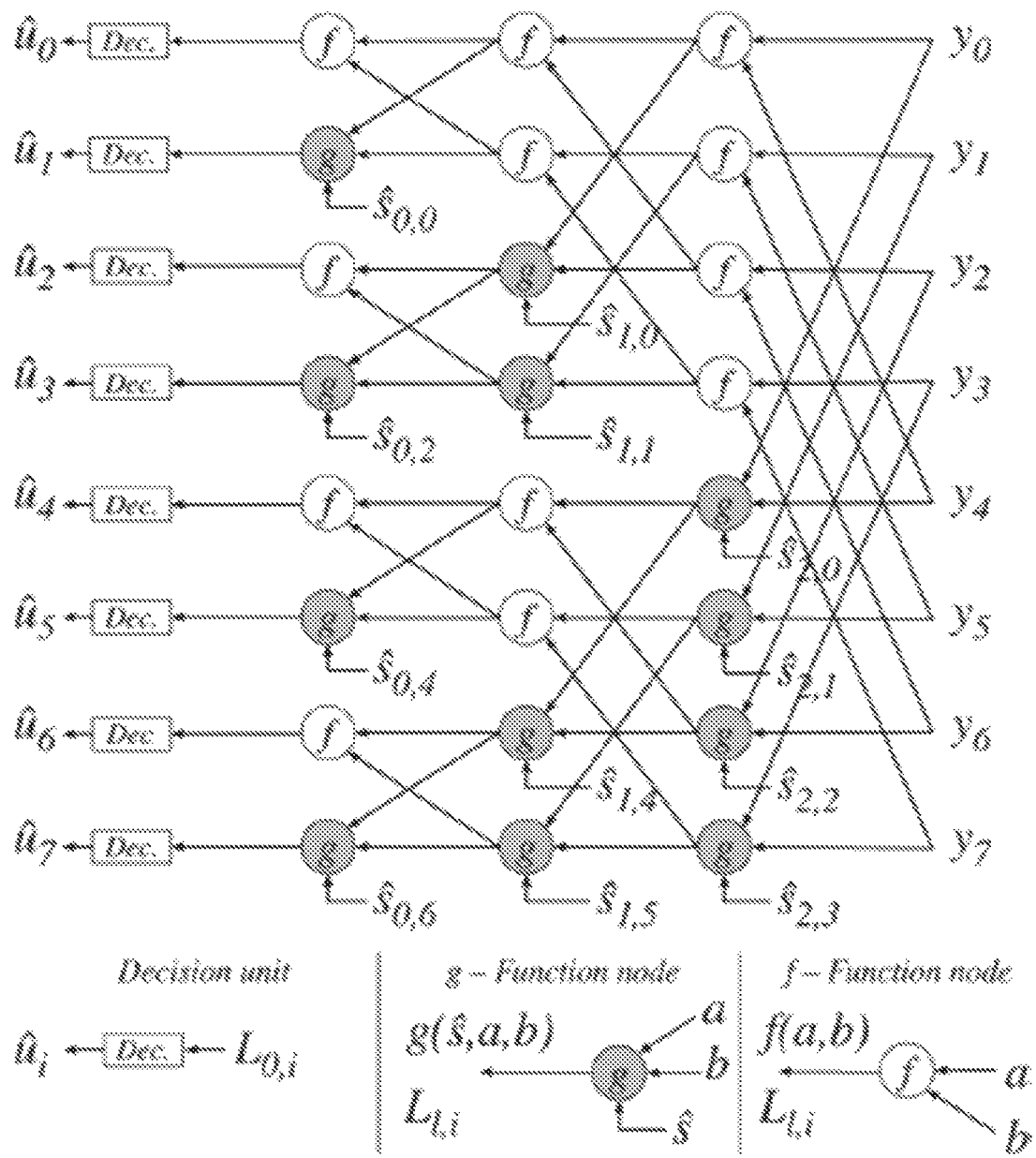
FIG. 3 illustrates a butterfly based decoder for the case of $N=8$.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Radio Node: As used herein, a "radio node" is either a radio access node or a wireless device.

Radio Access Node: As used herein, a "radio access node" or "radio network node" is any node in a radio access network of a cellular communications network that operates to wirelessly transmit and/or receive signals. Some examples of a radio access node include, but are not limited to, a base station (e.g., a New Radio (NR) base station (gNB) in a Third Generation Partnership Project (3GPP) Fifth Generation (5G) NR network or an enhanced or evolved Node B (eNB) in a 3GPP Long Term Evolution (LTE) network), a high-power or macro base station, a low-power base station (e.g., a micro base station, a pico base station, a home eNB, or the like), and a relay node.

Core Network Node: As used herein, a "core network node" is any type of node in a core network. Some examples of a core network node include, e.g., a Mobility Management Entity (MME), a Packet Data Network Gateway (P-GW), a Service Capability Exposure Function (SCEF), or the like.

Wireless Device: As used herein, a "wireless device" is any type of device that has access to (i.e., is served by) a cellular communications network by wirelessly transmitting and/or receiving signals to a radio access node(s). Some examples of a wireless device include, but are not limited to, a User Equipment device (UE) in a 3GPP network and a Machine Type Communication (MTC) device.

Network Node: As used herein, a "network node" is any node that is either part of the radio access network or the core network of a cellular communications network/system.

Note that the description given herein focuses on a 3GPP cellular communications system and, as such, 3GPP terminology or terminology similar to 3GPP terminology is oftentimes used. However, the concepts disclosed herein are not limited to a 3GPP system.

Note that, in the description herein, reference may be made to the term "cell;" however, particularly with respect to 5G NR concepts, beams may be used instead of cells and, as such, it is important to note that the concepts described herein are equally applicable to both cells and beams.

The most widely used polar decoder types to date are the Successive Cancellation (SC) and the List decoding of SC (SCL). Both SC and SCL make a (tentative or final) decision on each information bit one after another, without taking into account the knowledge of the future frozen bits when making a decision on any particular information bit. Their performances are thus suboptimal in general, compared to a Maximum-Likelihood (ML) decoder. The performance gap varies with the frozen bit locations with respect to the information bit locations.

Due to the successive nature of SC and SCL decoding operations, the order by which the SC is done can play a substantial role in the performance. It is particularly important when the information bit location is not optimally chosen. This can be caused by situations when some information bits are known at the receiver from other information and thus effectively become frozen bits. In general, in order to improve performance, it is often desirable to change the order of decoding of information bits and frozen bits to account for the knowledge of some future frozen bits. However, for a given set of locations for the information bit, conventional SC and SCL decoders can only perform the decoding in a specific order that corresponds to the natural ordering of the bit indices.

In some embodiments of the present disclosure, a method is provided for performing successive decoding in different orderings that can allow the SC/SCL decoder to take into account some future information bits and frozen bits when making decision on a particular information bit. The main idea is to apply certain permutation(s) to the Log-Likelihood Ratios (LLRs) before or during the decoding process, perform a basic polar decoding algorithm (e.g., SC decoding) in the normal process based on natural ordering of the bit indices, and then apply the corresponding inverse permutation(s) to the information bits in the end of the decoding process. While simple permutation is the preferred method, linear transformation(s) in general can be used.

Due to the tree structure of polar codes, such a process can be performed conditionally in any subtree of the decoding tree in order to re-order the decoding process for the section of the information/frozen bits that correspond to that subtree while keeping other subtrees unaffected. This allows a higher flexibility in changing the decoding order and thus more degree of freedom to improve performance through localized linear transforms.

By re-ordering the successive decoding process, some of the future frozen bits can be swapped in front of some information bits during decoding. As a result, the conventional successive decoding based on natural ordering can be used while taking into account those future frozen bit values that would otherwise be ignored by the conventional SC/SCL decoders. As a result, the decoding performance can be enhanced without the need of increasing the decoding complexity, e.g. through an increased list size of a SCL decoder.

Self-Similar Transformations

In the present disclosure, we focus the discussion on binary polar codes in the binary field $\mathcal{G}_2 \equiv \{0,1\}$. The basic idea can be straightforwardly generalized to non-binary polar codes.

Let $G_{N_0}$ be a kernel matrix of size $N_0 \times N_0$, with all its elements in $\mathcal{G}_2$, based on which the generating matrix of a polar code is generated. The most commonly used kernel matrix is the Arikan matrix [1]:

$$G_{N_0} = \begin{bmatrix} 1 & 0 \\ 1 & 1 \end{bmatrix}.$$

The generating matrix of the polar code G of mother code block length N is given by repeatedly applying Kronecker operation on $G_{N_0}$, i.e.

$$G_N = G_{N_0}^{\otimes \log_{N_0}(N)} = \overbrace{G_o \otimes G_o \otimes \ldots \otimes G_o}^{\log_{N_0}(N) \text{ times}}$$

where $\otimes$ denotes the Kronecker operation. Given a data vector $u=(u_0, u_1, \ldots, u_{N-1})$, the vector of coded bits after polar encoding is given by $x=uG_N$. For polar encoding, the data vector u is typically composed of both information bits and frozen bits. The information bits are assigned to bit locations of higher reliability. The frozen bits have known values (typically '0') and are assigned to bit locations of lower reliability.

The vector of coded bits x is then transmitted by the transmitter over the channel, possibly after further operations such as coded bit puncturing, interleaving, modulation symbol formulation, etc. The vector of coded bits x is received by the receiver as the corresponding vector y of the same length, after receiver processing including, for example, channel estimation, channel LLR calculation, de-interleaving, de-puncturing, etc. The vector y is the input to the polar decoder, which attempts to produce as output an estimate v of the information vector u. From v, the estimated information bits are delivered to higher layer for further processing, while the frozen bits are discarded. Typically the vector y is in the format of LLR values, which is the case when soft-decoding is used. However, one of skill in the art will readily appreciate that, if hard-decoding is alternatively used, then the vector y is in the format of hard decision values.

The basis of embodiments of the present disclosure is that there exists some invertible transformation T such that the following equation is satisfied for the polar generating matrix G:

$$G_N = T_N G_N T_N^{-1}. \tag{1}$$

We refer to such a transformation (matrix) $T_N$ as a self-similar transformation (matrix) for the polar code of code length N or for its generating matrix $G_N$. Self-similar transformations allow polar codes to be decoded successively in the transformed domain, as further illustrated below.

First we give some examples of self-similar transformation. There are many different self-similar transmissions. To simplify discussions, we focus on the case when the kernel matrix is the Arikan matrix. For this case, several kinds are of particular interests in practice, which are described below.

Bit-Reversal Permutation

The first kind is the bit-reversal permutation characterized by the bit-reversal matrix $R_N$ that performs permutation in such a way that $e_i R_N = e_{r(i)}$, for all $i \in \{0, 1, 2, \ldots, N-1\}$, where $e_i$ denotes a vector with all zeros except at the ith position where the element is one, and where $r(i) \in \{0, 1, 2, \ldots, N-1\}$ denotes a number whose binary representation is in a reversed bit order as the binary representation of the number i. For this kind of self-similar transformation, we have $R_N^{-1} = R_N$, and $$G_N = R_N G_N R_N. \tag{2}$$

Least-Significant Bit (LSB) to Most Significant Bit (MSB) (or MSB-to-LSB) Permutation The second kind of self-similar transformation is the last-to-first permutation matrix $F_N$ of the following form:

$$F_N = \left[ I_{N/2} \otimes \begin{bmatrix} 1 \\ 0 \end{bmatrix} \middle| I_{N/2} \otimes \begin{bmatrix} 0 \\ 1 \end{bmatrix} \right]$$

where $I_{N/2}$ is the (N/2)×(N/2) identity matrix. This matrix permutes the input vector in such a way that $e_i F_N = e_{\phi(i)}$, for all $i \in \{0, 1, 2, \ldots, N-1\}$, where $\phi(i) \in \{0, 1, 2, \ldots, N-1\}$ denotes a number whose binary representation is almost the same binary representation of the number i except that the LSB of the index i becomes the MSB of i. In other words, the last-to-first permutation matrix permutes such that the LSB of the index of the input becomes the MSB of the index of the output. It is easy to verify that $F_N F_N^T = F_N F_N^T = I_N$ and thus $F_N^{-1} = F_N^T$. In other words, multiplying a vector from the left on $F_N^T$ effectively permutes the vector so that the MSB of the binary representation of the component indices is moved to the LSB, i.e. the inverse operation of multiplying the vector by $F_N$.

It follows that Equation (1) is satisfied by setting $T_N = F_N$ or setting $T_N = F_N^T$ as $$G_N = F_N G_N F_N^T. \quad (3)$$

$$G_N = F_N^T G_N F_N. \quad (4)$$

So $F_N$ is also a self-similar transformation for any N. It can easily be verified that $R_N = F_N \cdot F_N \ldots F_N \cdot F_N = F_N^{log_2 N}$ and $R_N = F_N^T \cdot F_N^T \ldots F_N^T \cdot F_N^T = (F_N^{log_2 N})^T$.

Any-Bit-to-MSB (or any-Bit-to-LSB) Permutation

An important kind of self-similar transformation that generalizes an LSB-to-MSB (or alternatively MSB-to-LSB) permutation is to move any bit (instead of just the LSB) in the binary representation of bit indices to the MSB (or alternatively LSB). This can be achieved by performing Kronecker products on $F_N$ (or $P_N^T$) as $$A_{M,N} = F_M \otimes I_{\frac{N}{M}}$$

for any M that is a power of 2 and is no larger than N. The effect of the transformation $A_{M,N}$ is to permute the input vector in such a way that the ($\log_2$ M)th MSB in the binary representation of the bit indices moves to the MSB location. It follows easily that Equation (1) is satisfied since $$A_{M,N} G_N A_{M,N}^T = \left(F_M \otimes I_{\frac{N}{M}}\right)\left(G_M \otimes G_{\frac{N}{M}}\right)\left(F_M^T \otimes I_{\frac{N}{M}}\right) =$$

$$(F_M G_M F_M^T) \otimes G_{\frac{N}{M}} = G_M \otimes G_{\frac{N}{M}} = G_N$$

where the identity $(A \otimes B)(C \otimes D) = (AC \otimes BD)$ is used in the second equality above.

In general, the product of any self-similar transformation is also self-similar in the same dimension, and the Kronecker product of any self-similar transformation is also self-similar (for the corresponding larger matrix), which can be proven straightforwardly with derivations similar as that shown above.

Arbitrary Bit Permutation

By applying the Any-Bit-to-MSB permutations multiple times, one can achieve any permutation of the binary representation of the bit indices. More specifically, let $\mu$: $\{1, 2, \ldots, \log_2 N\} \to \{1, 2, \ldots, \log_2 N\}$ be any permutation mapping on the bits in the binary representation of each bit-channel index, with $\mu(1)$ and $\mu(\log_2 N)$ point to the LSB and MSB, respectively. One can define an arbitrary bit permutation transformation matrix as $$S_{\mu,N} \triangleq A_{M_1,N} A_{M_1,N} A_{M_2,N} \ldots A_{M_{\log_2 N}, N} \text{ where } \{M_{i,N}\}_{i=1}^{\log_2 N}$$

can be chosen one-by-one in a straightforward manner such that the $\mu(i)$-th bit is in the i-th position in the final permuted binary representation. Since the product of any self-similar transformation is also self-similar, we have $S_{\mu,N}$ satisfying Equation (1) in the following form:

$$G_N = S_{\mu,N} G_N S_{\mu,N}^T. \quad (5)$$

Transformed Successive Cancellation (TSC) Decoding

Figure 4:
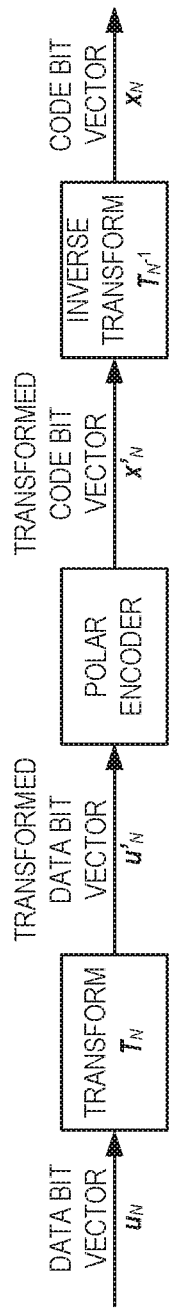
FIG. 4 illustrates a polar encoder according to some embodiments of the present disclosure.

The reason for studying self-similar transformations is that it allows us to perform polar encoding and decoding in the transformed domain. Since $G_N = T_N G_N T_N^{-1}$, the encoding procedure of $x = u G_N$ is equivalent to $$x_N T_N = (u_N T_N) G_N \quad (6)$$

for any self-similar transformation $T_N$. The polar encoding with transformation can be described as the following. The data vector $u_N$ is transformed by $T_N$ to obtain the transformed data vector $u_N' = u_N T_N$. The basic polar encoder takes $u_N'$ as input and generates the transformed code bit vector $x_N' = x_N T_N$ as output: $x_N' = u_N' G_N$. By applying the inverse transform $T_N^{-1}$ to $x_N'$, the final encoder output $x_N$ is obtained, which is ready to be transmitted over the channel. This is illustrated in FIG. 4. Note that the blocks illustrated in FIG. 4 may be implemented in hardware or a combination of hardware and software.

Correspondingly, the polar decoding with transformation can be described as the following. Corresponding to code bit vector $x_N$, the received code bit vector $y_N$ is taken as input to the decoding process. First transform the channel LLR vector $y_N$, received for example from the demodulator, by $T_N$ to obtain the transformed code bit vector $y_N'$. The vector $y_N'$ is the input to the basic polar decoder to obtain the transformed data bit vector $v_N' = V_N T_N$. The basic polar decoder typically performs the SC or SCL decoding to obtain the estimated transformed data vector $v_N' = V_N T_N$. Finally, the inverse transform is applied to obtain the estimated data bit vector $v_N$ from $v_N'$. The estimated information bits are then extracted from the information bit locations within $V_N$, while discarding the rest (which are typically frozen bits).

Figure 5:
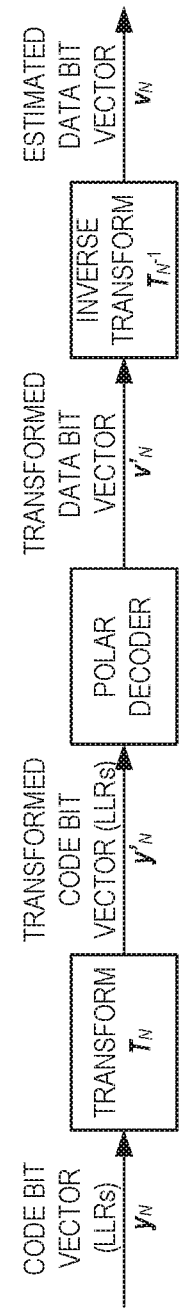
FIG. 5 illustrates a polar decoder according to some embodiments of the present disclosure.

The decoding of polar code with transformation is illustrated in FIG. 5. Note that the blocks illustrated in FIG. 5 may be implemented in hardware or a combination of hardware and software. Note that the estimated (transformed) data vectors $v_N'$ and $v_N$ may be represented by formats: (a) binary value (i.e., hard bits) of the data bits; or (b) soft information (e.g., LLRs) of the data bits.

The decoder output is a correct estimation, if $v_N = u_N$ (here it is assumed that $v_N$ is the hard-decision output of the decoder). Otherwise the decoder output is erroneous, which may result due to poor channel condition.

When $T_N$ is a permutation matrix, like those described in the previous section, the decoding procedure can be carried out using any of the permutations. As a result, using this transformed decoding structure, any two sets of information bit locations (or information set) can be transformed into each other using these permutations of the index bits of the binary representation of the bit channels. Each set of information bit locations can be used together with the basic polar decoder (typically SC or SCL decoding) and yield an estimate of the information bits being carried.

In general, when the transformation $T_N$ is self-similar, the transformation in transformed polar encoding does not need to be performed, since it produces the same output as the ordinary polar encoding without transformation. In contrast, the transformed polar decoding is useful in that the transformation introduces different order of estimating the bit values in traversing the tree that may improve the decoding performance. However, when the transformation $T_N$ is not self-similar, transformed polar encoding is different from the ordinary polar encoding without transformation, and the transformation cannot be omitted. In this case, the transformed polar decoding is a corresponding method of decoding the transformed polar code.

Figure 6:
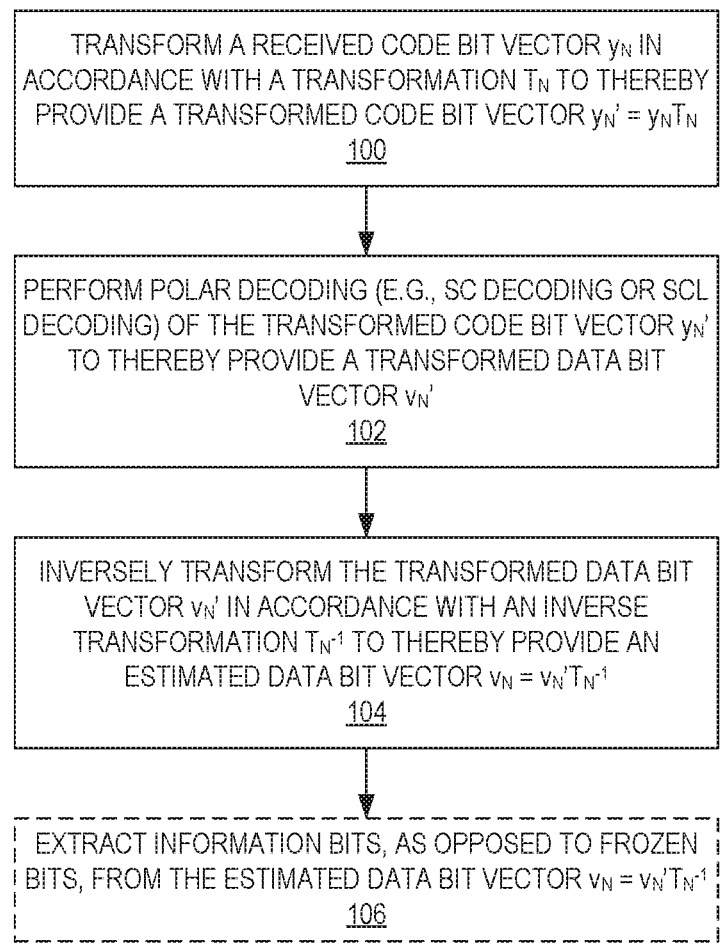
FIG. 6 is a flow chart that illustrates the operation of a receiving node to perform polar decoding according to some embodiments of the present disclosure.

FIG. 6 illustrates a polar decoding process in accordance with at least some of the embodiments described herein. This processing is performed by a receiving node (e.g., a radio node in a wireless system operating to receive a wireless signal transmitted by another radio node in the wireless system, as described below). As described herein, the receiving node transforms a received code bit vector $y_N$ in accordance with a transformation $T_N$ to thereby provide a transformed code bit vector $y_N'=y_N T_N$ (step 100). As discussed above, the transformation $T_N$ is a self-similar transformation, i.e., the transformation $T_N$ satisfies $G_N=T_N G_N T_N^{-1}$. Examples of the self-similar transformation are provided above.

The receiving node performs polar decoding (e.g., SC decoding or SCL decoding) of the transformed code bit vector $y_N'$ to thereby provide a transformed data bit vector $v_N'$ (step 102). The receiving node then inversely transforms the transformed data bit vector $v_N'$ in accordance with the inverse transformation $T_N^{-1}$ to thereby provide an estimated data bit vector $v_N=v_N' T_N^{-1}$ (step 104). Optionally, the receiving node extracts information bits, as opposed to known, frozen bits, from the estimated data bit vector $v_N=v_N' T_N^{-1}$ (step 106).

Conditional TSC Decoding

Non-Overlapping Decomposition

Figure 7:
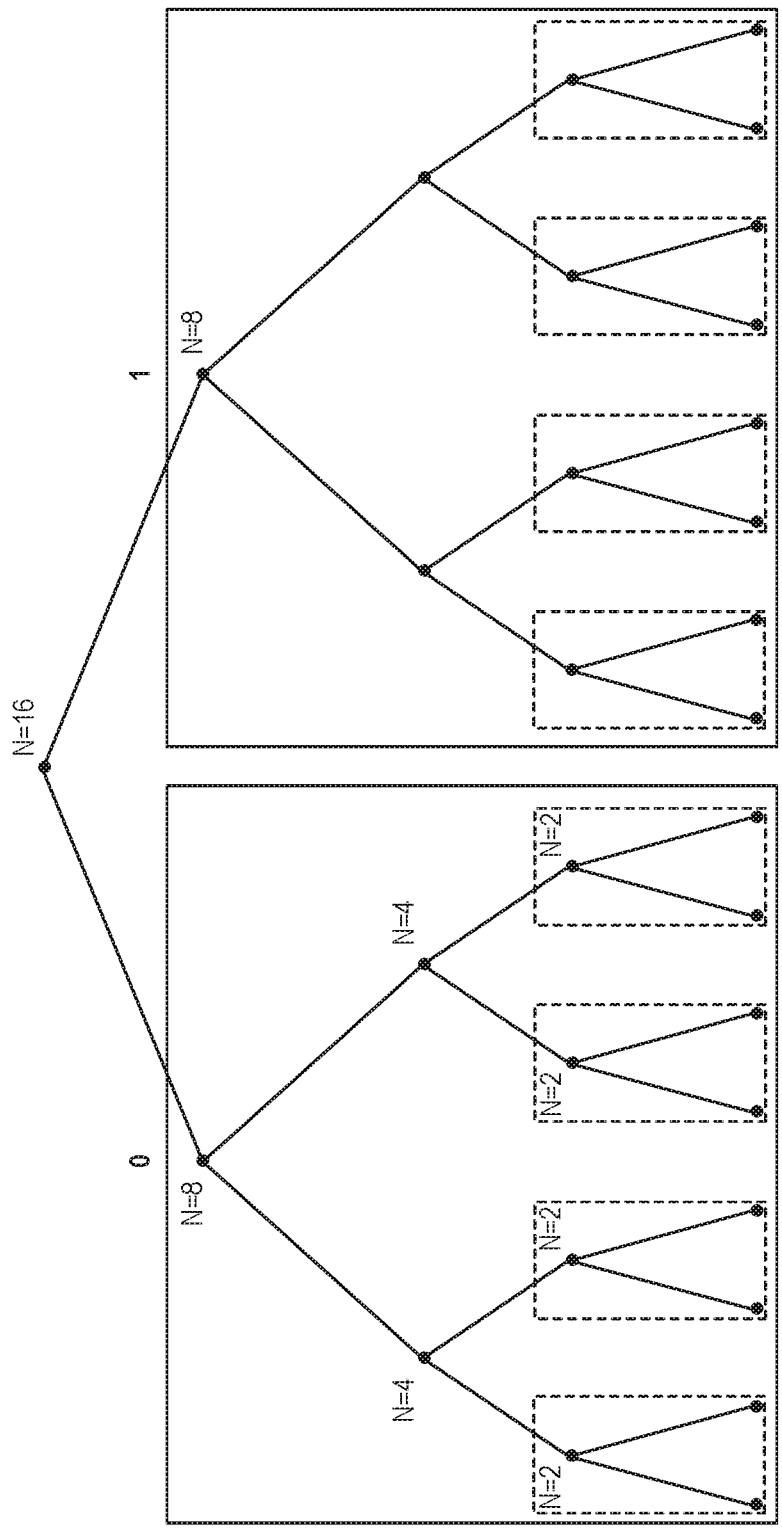
FIG. 7 illustrates one example of non-overlapping decomposition of a length N polar code.

Polar code has a tree structure. Each of the leaf nodes of the tree represents a data bit. A polar code of code length N can be formed by combining the two polar codes of length/2, as illustrated in FIG. 7 where a polar code of length N=16 can be viewed as the combination of two codes of length N=8, each represented by a subtree. Each of the two subtrees of length N=8 corresponds to conditioning on the two possible values (0 or 1) of the MSB in the binary representation of the bit-channel indices that can be used to carry a data bit. This decomposition or conditioning into smaller subtrees can be recursively performed until a polar code of smallest block length of N=2 is reached.

During a typical SC or SCL decoding process, each of the leaf nodes in the tree shown in FIG. 7 is processed from left-to-right one by one to make a decision (or a tentative decision in the case of list decoding) on the corresponding data bit. The computation of LLRs are traversed through the tree in a depth-first-search manner. In effect, polar codes of smallest block length (N=2) are processed one at a time from left to right until all information bits are decoded (or leaf nodes are traversed).

Figure 8:
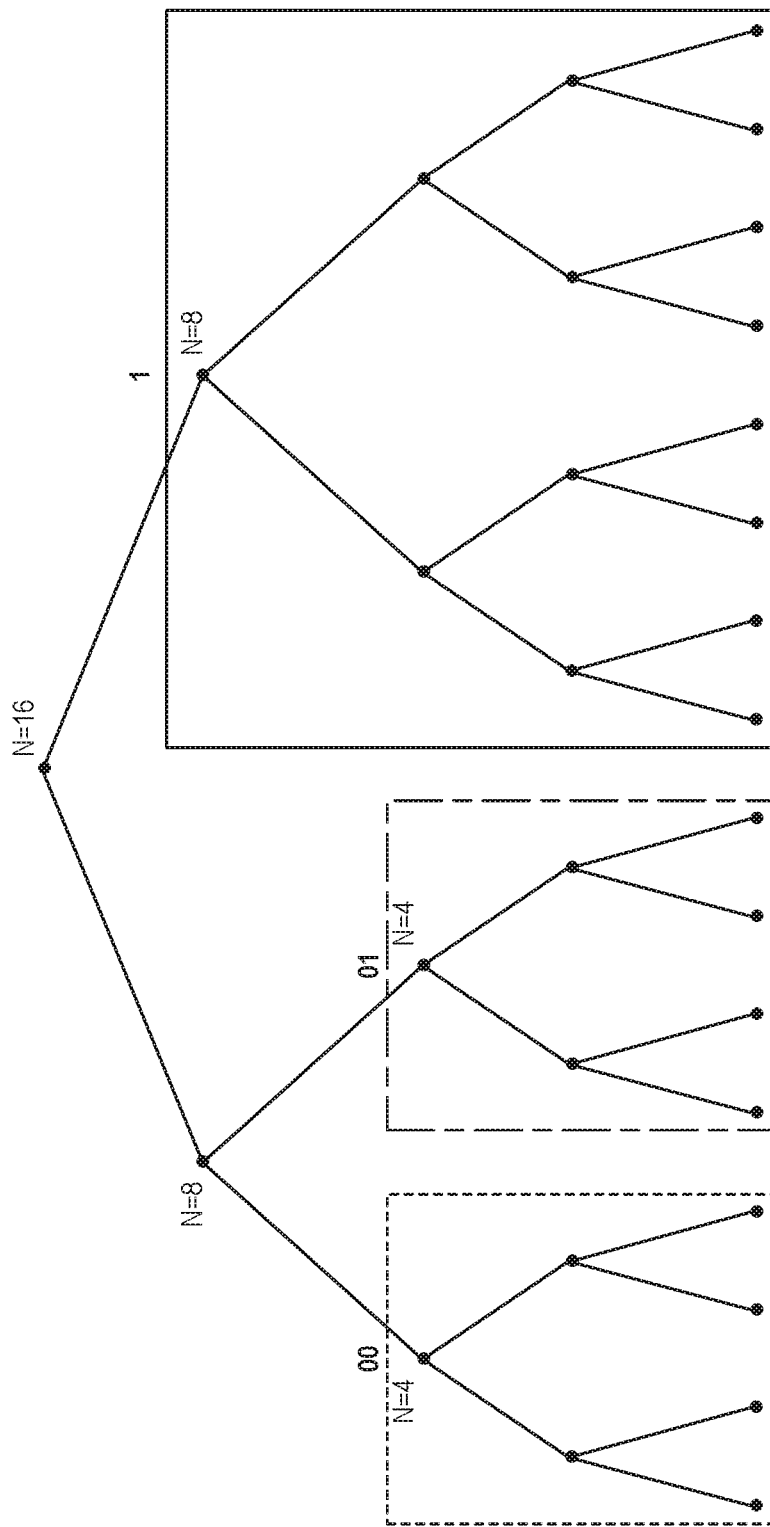
FIG. 8 illustrates a decomposition of a polar code of length 16 into two polar codes of length 4 and one polar code of length 8, based on a prefix-free code $C=\{00, 01, 1\}$.

In general, one can decompose a polar code of length N into multiple independent polar codes of smaller lengths according to any (possibly) variable-length prefix-free code $C=\{b_1, b_2, \ldots, b_Q\}$ of which each codeword $b_i$ has a maximum length of N bits, where Q is an integer no larger than $(\log_2 N)-2$. A prefix-free code is a code where no codeword is a prefix of another codeword. Each component polar code that the original polar code is decomposed into is represented by a subtree of the overall tree structure, where the overall tree structure represents the original polar code of length N. The prefix-free property ensures that the subtrees that represent all component polar codes do not overlap with each other. For example, FIG. 8 shows a decomposition of a polar code of length 16 into two polar codes of length 4 and one polar code of length 8, based on a prefix-free code $C=\{00, 01, 1\}$.

According to some embodiments of the present disclosure, the transformed polar encoding and decoding can be applied to each of these component polar codes individually, possibly each with a different self-similar transformation matrix $T_{N_i}$ that corresponds to a codeword $b_i$. In other words, during successive SC or SCL decoding of a polar code of length N, individual transforms of corresponding sizes may be applied for each of the component polar codes.

Figure 9:
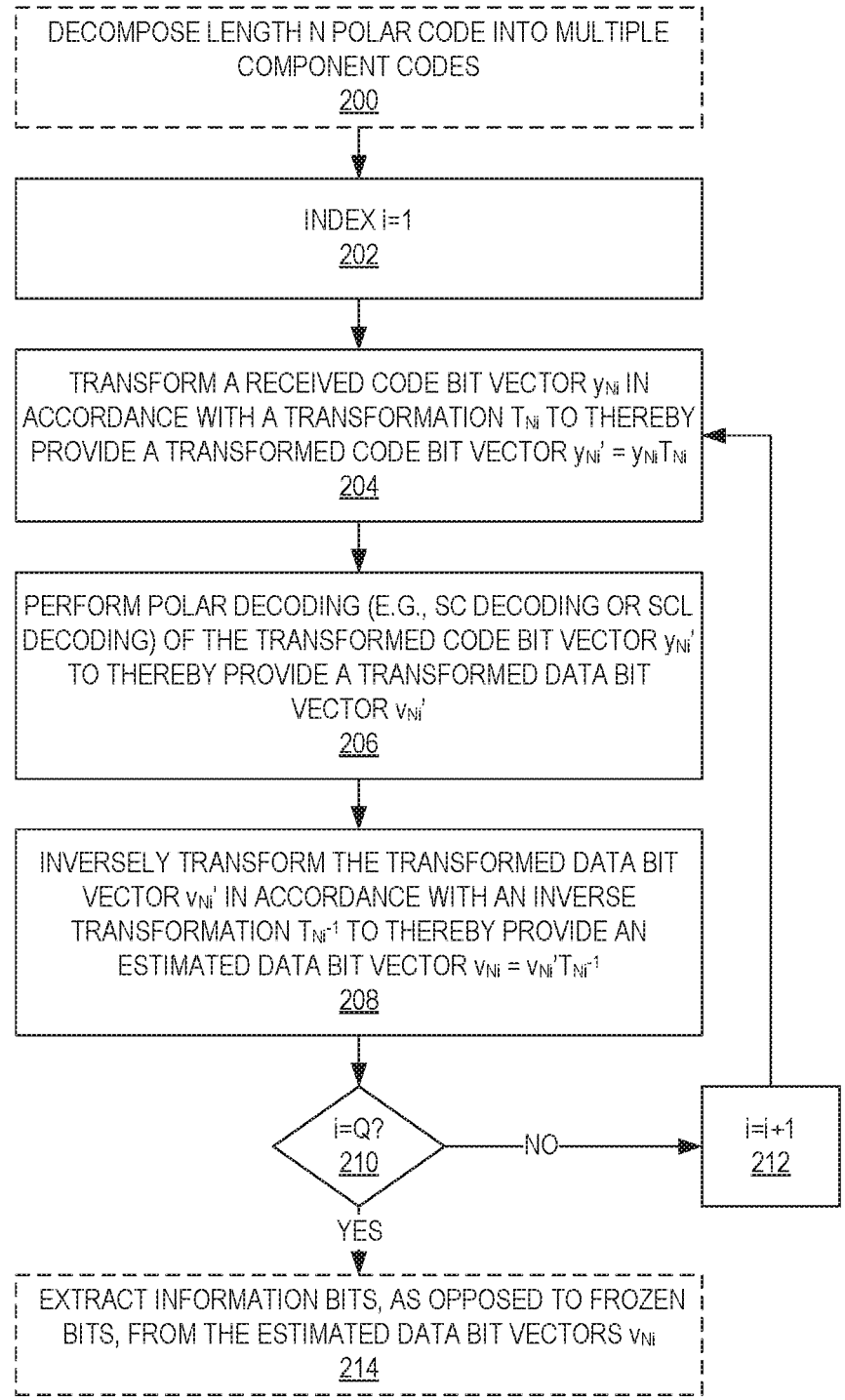
FIG. 9 is a flow chart that illustrates one example of a process (performed by a receiving node) to perform polar decoding for each of multiple component polar codes according to some embodiments of the present disclosure.

FIG. 9 is a flow chart that illustrates one example of a process (performed by a receiving node) to perform polar decoding for each of multiple component polar codes. In FIG. 9, the index "i" is an index to the component polar codes and, likewise, an index to the codeword $b_i$ in the prefix-free code $C=\{b_1, b_2, \ldots, b_Q\}$. Again, optional steps are illustrated with dashed lines.

As illustrated, the receiving node optionally decomposes the length N polar code (which was used by the transmitting node for polar encoding) into multiple component codes as described above (step 200). The decomposition is not necessarily performed by the receiving node (e.g., the decomposition may be predefined). The index i is set to 1 (step 202). As described herein, the receiving node transforms a received code bit vector $y_N$ in accordance with a transformation $T_{N_i}$ to thereby provide a transformed code bit vector $y_{N_i}'=y_{N_i} T_{N_i}$ (step 204). As discussed above, the transformation $T_{N_i}$ is a self-similar transformation. Further, different transformations $T_{N_i}$ may be used for different component polar codes, as described above.

The receiving node performs polar decoding (e.g., SC decoding or SCL decoding) of the transformed code bit vector $y_{N_i}'$ to thereby provide a transformed data bit vector $v_{N_i}'$ (step 206). The receiving node then inversely transforms the transformed data bit vector $v_{N_i}'$ in accordance with the inverse transformation $T_{N_i}^{-1}$ to thereby provide an estimated data bit vector $v_{N_i}=v_{N_i}' T_{N_i}^{-1}$ (step 208). If the index has not yet reached that of the last component polar code (step 210, NO), the index is incremented (step 212) and the process returns to step 204 and is repeated for the next component polar code. Optionally, the receiving node extracts information bits, as opposed to known, frozen bits, from the estimated data bit vectors $v_{N_i}=v_{N_i}' T_{N_i}^{-1}$ (step 214).

The benefit of doing the conditional or tree-structured transformed SC or SCL decoding is that it provides more flexibility to permute the bit-channels. This allows more subtrees or component polar codes to have a special structure which can be then be exploited by specialized decoding implementation. For example, those methods of simplified SC and SCL decoding described in [3] achieved by specially treating subtrees or component polar codes with code rates that are (almost) zero and one may be used after transformation is performed in each of the component polar code. This can reduce the latency and energy consumption in the decoding process.

In other embodiments of the present disclosure, for a given polar tree (or subtree), L different transformations are applied, where L>1. For each transformation, a SC decoding is applied to generate the i-th candidate tree (or subtree) output, i=1, 2, . . . , L. After obtaining the L candidates, the best candidate(s) is then selected as the final output of the tree (or subtree). The candidate can be selected according several different types of criteria, including:

(a) Path metric magnitude;
(b) Cyclic Redundancy Check (CRC) checksum; and
(c) Parity-checksum.

Figure 10:
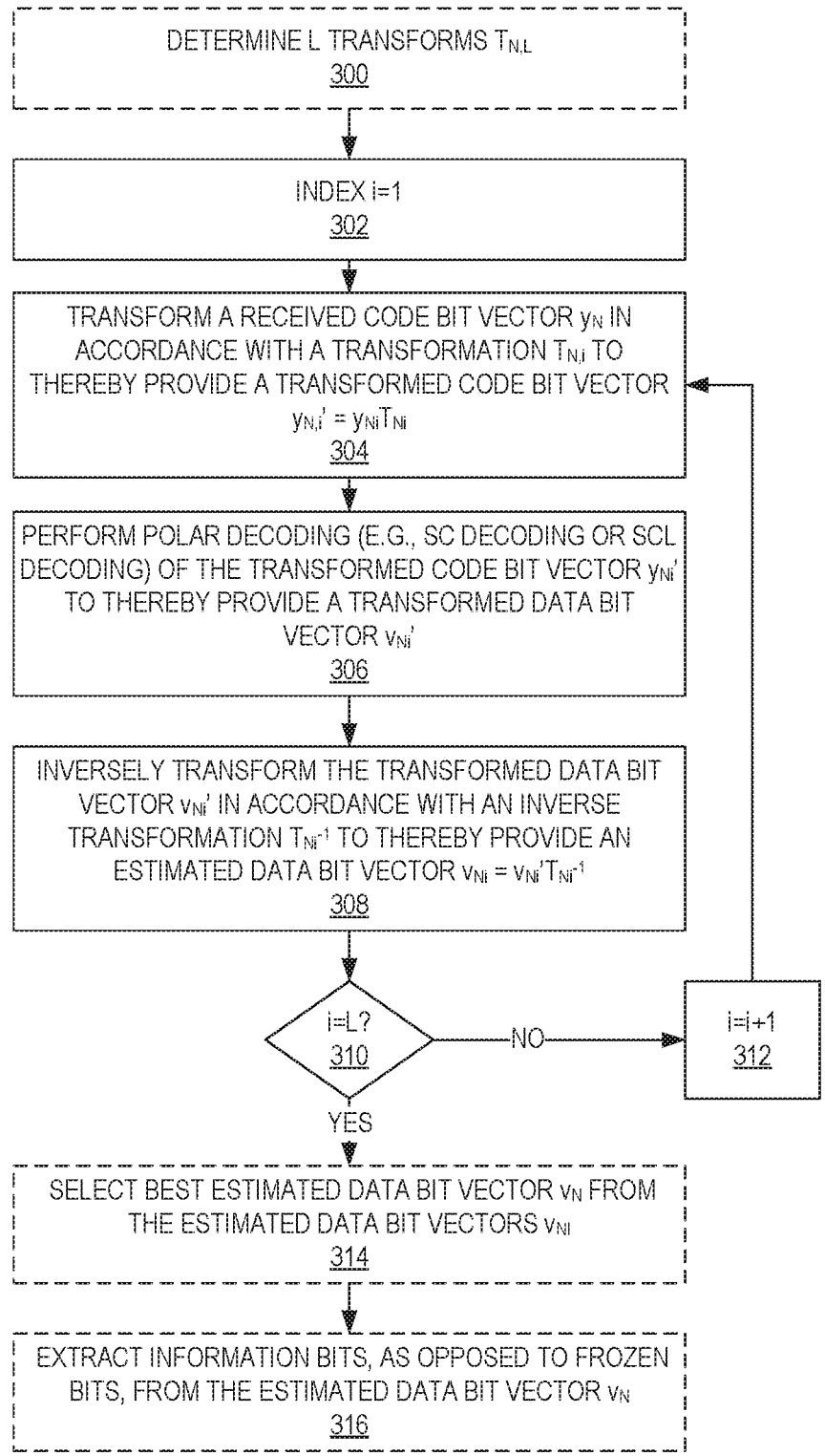
FIG. 10 is a flow chart that illustrates one example of a process (performed by a receiving node) to perform polar decoding using L different transformations are applied, where $L>1$, according to some embodiments of the present disclosure.

FIG. 10 is a flow chart that illustrates one example of a process (performed by a receiving node) to perform polar decoding using L different transformations are applied, where L>1. In FIG. 10, the index "i" is an index to the ith transformation $T_{N_i}$. Again, optional steps are illustrated with dashed lines. As illustrated, the receiving node optionally determines the L different transformations $T_{N_i}$ for i= {1, 2, . . . , L} (step 300). The L different transformations $T_{N_i}$ are not necessarily determined by the receiving node (e.g., they may be predefined or determined by another node). The index i is set to 1 (step 302). As described herein, the receiving node transforms a received code bit vector $y_N$ in accordance with a transformation $T_{N_i}$ to thereby provide a transformed code bit vector $y_{N_i}'=y_N T_{N_i}$ (step 304). As discussed above, the transformation $T_{N_i}$ is a self-similar transformation.

The receiving node performs polar decoding (e.g., SC decoding or SCL decoding) of the transformed code bit vector $y_{N_i}'$ to thereby provide a transformed data bit vector $v_{N_i}'$ (step 306). The receiving node then inversely transforms the transformed data bit vector $v_{N_i}'$ in accordance with the inverse transformation $T_{N_i}^{-1}$ to thereby provide an estimated data bit vector $v_{N_i}=v_{N_i}'T_{N_i}^{-1}$, (step 308). If the index has not yet reached that of the last component polar code (step 310, NO), the index is incremented (step 312) and the process returns to step 304 and is repeated for the next component polar code.

Optionally, once all L different transformations $T_{N_i}$ have been processed, the receiving node selects a best estimated data bit vector $v_N$ from among the estimated data bit vectors $v_{N_i}=v_{N_i}'T_{N_i}^{-1}$ (step 314). As discussed above, this selection may be based on any suitable criteria such as, e.g., one or more of a path metric magnitude, CRC checksum, and/or parity-checksum. Optionally, the receiving node extracts information bits, as opposed to known, frozen bits, from the estimated data bit vector $v_N$ (step 316).

Overlapping Decomposition

Figure 11:
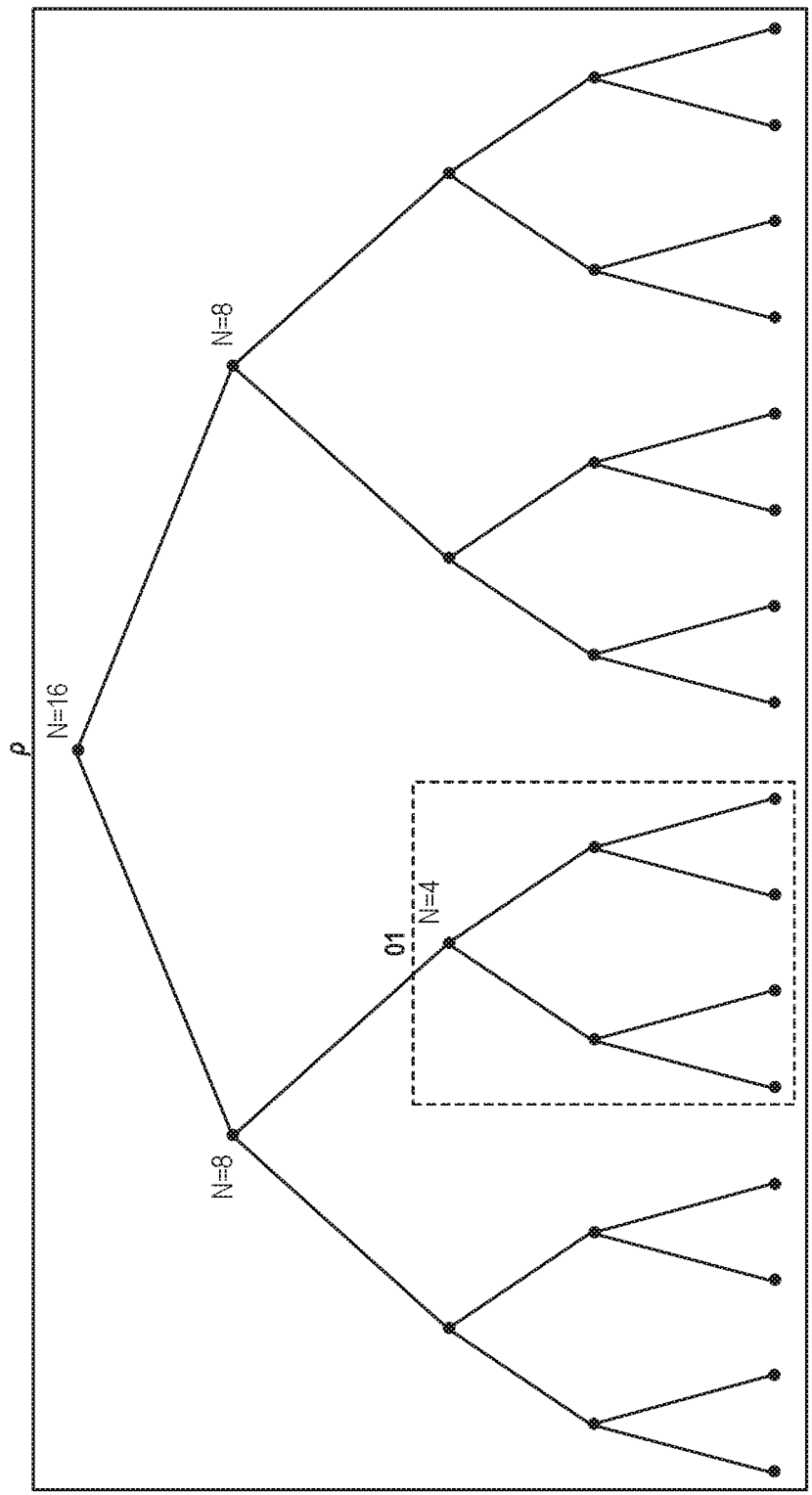
FIG. 11 illustrates one example of an overlapping subtree decomposition for which conditional Transformed Successive Cancellation (TSC) decoding can be performed according to some embodiments of the present disclosure.

Non-overlapping decomposition of a polar code into smaller component polar codes is only one simple and possible way of conditional TSC decoding. In general, conditional TSC decoding can be performed with overlapping subtree decomposition as well as illustrated in FIG. 11. This kind of decomposition can also be described by a variable-length code C with a special symbol ρ to represent the root of the tree. The main difference is that the code C may not be prefix-free. For example, FIG. 11 describes a code {ρ, 01}, where ρ denotes the root of the tree. Same as non-overlapping decomposition, each codeword $b_i$ in the variable-length code represents a subtree and an associated linear transformation $T_{N_i}$.

TSC decoding with overlapping decomposition introduces further flexibility in changing the order by which the data bits are decoded.

TSC decoding with overlapping decomposition may be performed as illustrated in, e.g., FIG. 9 but where the variable-length code C is not prefix-free.

Example System

Figure 12:
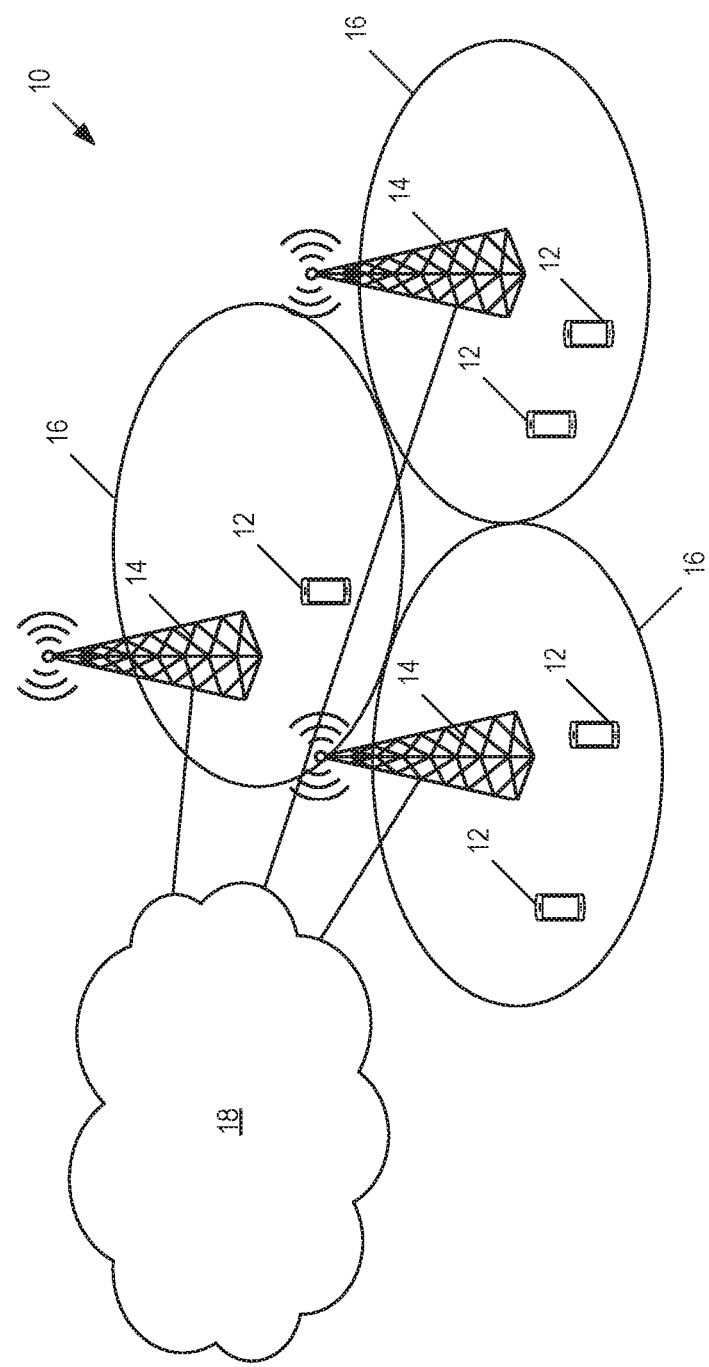
FIG. 12 illustrates one example of a wireless system in which embodiments of the present disclosure may be implemented.

FIG. 12 illustrates one example of a wireless system 10 (e.g., a cellular communications network such as, for example, a 3GPP 5G or NR network) in which embodiments of the present disclosure may be implemented. As illustrated, a number of wireless devices 12 (e.g., UEs) wirelessly transmit signals to and receive signals from radio access nodes 14 (e.g., gNBs), each serving one or more cells 16. The radio access nodes 14 are connected to a core network 18. The core network 18 includes one or more core network nodes (e.g., MMEs, Serving Gateways (S-GWs), and/or the like).

Note that the polar decoder of FIG. 5 as well as the polar decoding process described above (e.g., with respect to FIGS. 6-11) may be implemented in any radio node within the wireless system 10 such as, for example, the wireless devices 12 and/or the radio access nodes 14.

Figure 13:
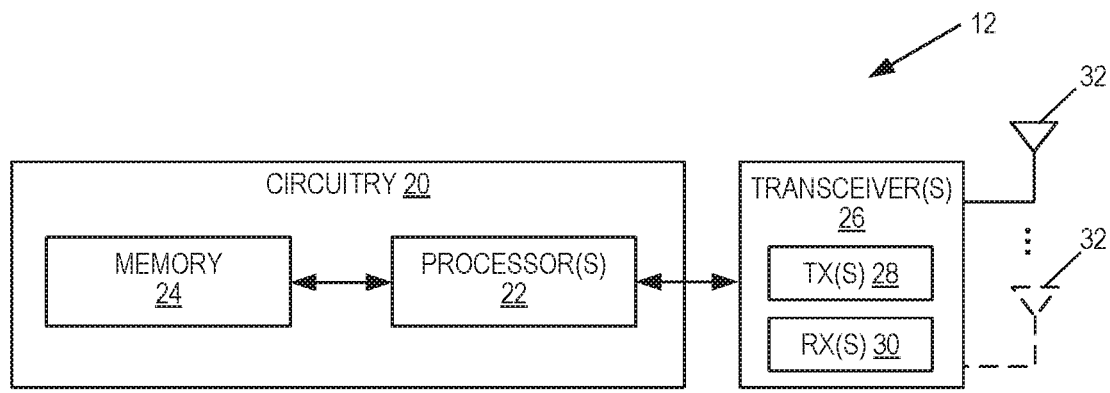
FIGS. 13 and 14 illustrate example embodiments of a wireless device in which embodiments of the present disclosure may be implemented.

FIG. 13 is a schematic block diagram of the wireless device 12 (e.g., UE) according to some embodiments of the present disclosure. As illustrated, the wireless device 12 includes processing circuitry 20 comprising one or more processors 22 (e.g., Central Processing Units (CPUs), Application Specific Integrated Circuits (ASICs), Field Programmable Gate Arrays (FPGAs), Digital Signal Processors (DSPs), and/or the like) and memory 24. The wireless device 12 also includes one or more transceivers 26 each including one or more transmitters 28 and one or more receivers 30 coupled to one or more antennas 32. In some embodiments, the functionality of the wireless device 12 described above may be implemented in hardware (e.g., via hardware within the circuitry 20 and/or within the processor(s) 22) or be implemented in a combination of hardware and software (e.g., fully or partially implemented in software that is, e.g., stored in the memory 24 and executed by the processor(s) 22).

In some embodiments, a computer program including instructions which, when executed by the at least one processor 22, causes the at least one processor 22 to carry out at least some of the functionality of the wireless device 12 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as memory).

Figure 14:
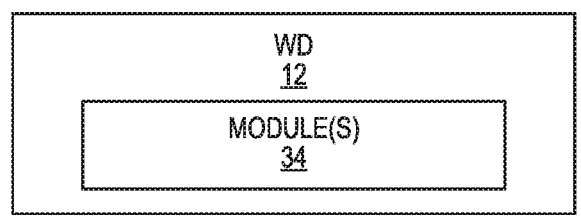

FIG. 14 is a schematic block diagram of the wireless device 12 (e.g., UE) according to some other embodiments of the present disclosure. The wireless device 12 includes one or more modules 34, each of which is implemented in software. The module(s) 34 provide the functionality of the wireless device 12 described herein.

Figure 15:
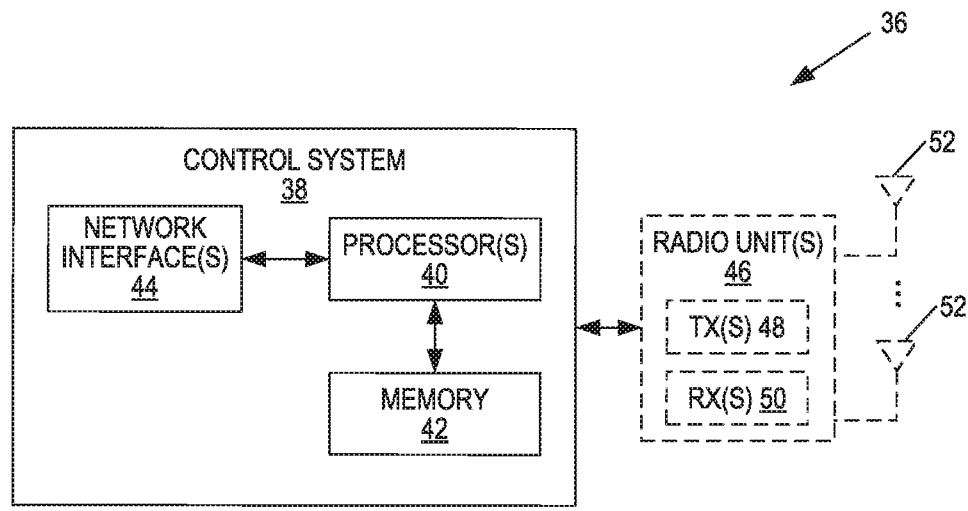
FIGS. 15 through 17 illustrate example embodiments of a network node in which embodiments of the present disclosure may be implemented.

FIG. 15 is a schematic block diagram of a network node 36 (e.g., a radio access node 14 such as, for example, a gNB or a network node such as a core network node) according to some embodiments of the present disclosure. As illustrated, the network node 36 includes a control system 38 that includes circuitry comprising one or more processors 40 (e.g., CPUs, ASICs, DSPs, FPGAs, and/or the like) and memory 42. The control system 38 also includes a network interface 44. In embodiments in which the network node 36 is a radio access node 14, the network node 36 also includes one or more radio units 46 that each include one or more transmitters 48 and one or more receivers 50 coupled to one or more antennas 52. In some embodiments, the functionality of the network node 36 (e.g., the functionality of the radio access node 14) described above may be fully or partially implemented in software that is, e.g., stored in the memory 42 and executed by the processor(s) 40.

Figure 16:
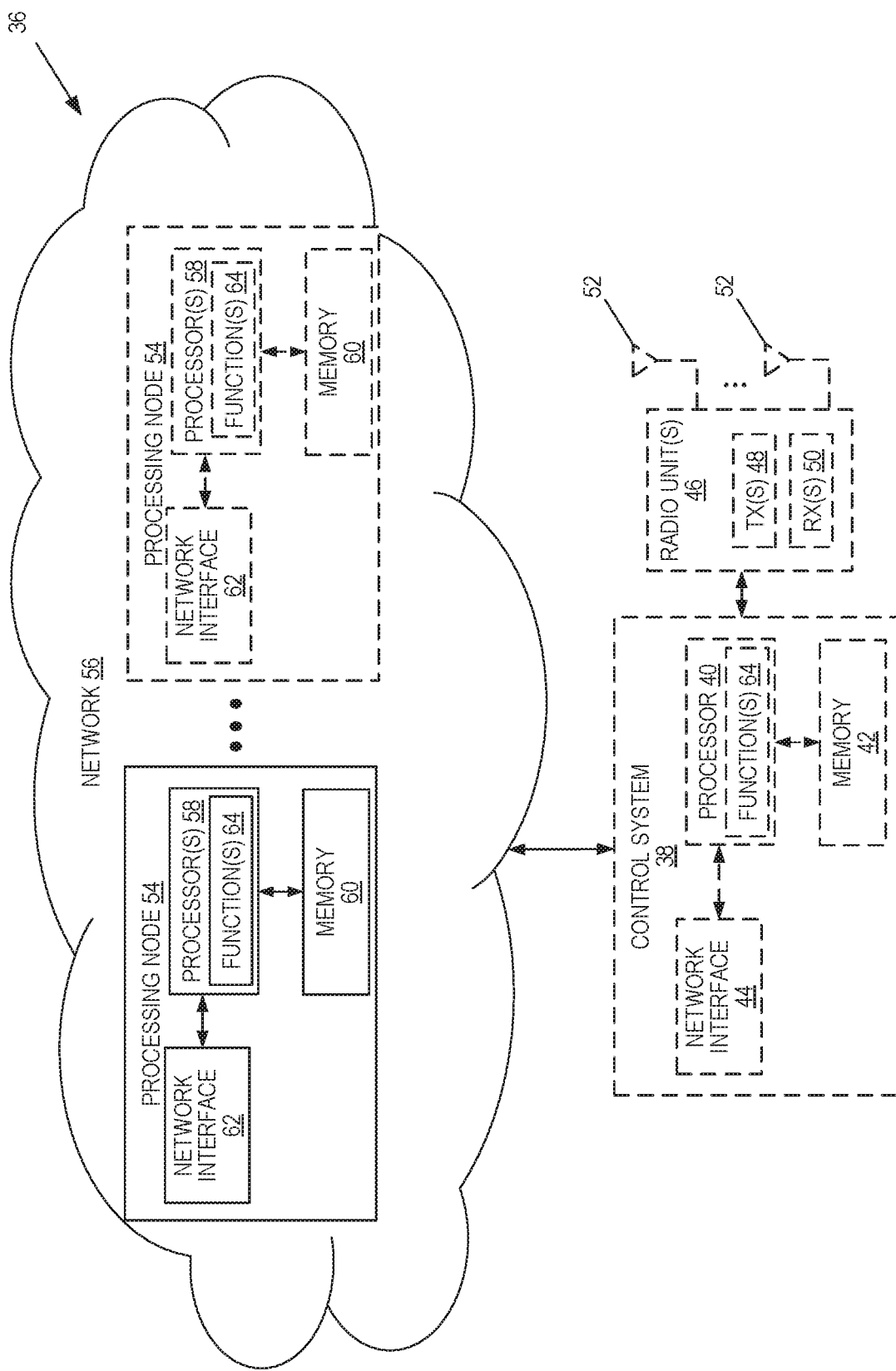

FIG. 16 is a schematic block diagram that illustrates a virtualized embodiment of the network node 36 (e.g., the radio access node 14) according to some embodiments of the present disclosure. As used herein, a "virtualized" network node 36 is a network node 36 in which at least a portion of the functionality of the network node 36 is implemented as a virtual component (e.g., via a virtual machine(s) executing on a physical processing node(s) in a network(s)). As illustrated, the network node 36 optionally includes the control system 38, as described with respect to FIG. 15. In addition, if the network node 36 is the radio access node 14, the network node 36 also includes the one or more radio units 46, as described with respect to FIG. 15. The control system 38 (if present) is connected to one or more processing nodes 54 coupled to or included as part of a network(s) 56 via the network interface 44. Alternatively, if the control system 38 is not present, the one or more radio units 46 (if present) are connected to the one or more processing nodes 54 via a network interface(s). Alternatively, all of the functionality of the network node 36 described herein may be implemented in the processing nodes 54 (i.e., the network node 36 does not include the control system 38 or the radio unit(s) 46). Each processing node 54 includes one or more processors 58 (e.g., CPUs, ASICs, DSPs, FPGAs, and/or the like), memory 60, and a network interface 62.

In this example, functions 64 of the network node 36 described herein are implemented at the one or more processing nodes 54 or distributed across the control system 38 (if present) and the one or more processing nodes 54 in any desired manner. In some particular embodiments, some or all of the functions 64 of the network node 36 described herein are implemented as virtual components executed by one or more virtual machines implemented in a virtual environment(s) hosted by the processing node(s) 54. As will be appreciated by one of ordinary skill in the art, additional signaling or communication between the processing node(s) 54 and the control system 38 (if present) or alternatively the radio unit(s) 46 (if present) is used in order to carry out at least some of the desired functions. Notably, in some embodiments, the control system 38 may not be included, in which case the radio unit(s) 46 (if present) communicates directly with the processing node(s) 54 via an appropriate network interface(s).

In some particular embodiments, higher layer functionality (e.g., layer 3 and up and possibly some of layer 2 of the protocol stack) of the network node 36 may be implemented at the processing node(s) 54 as virtual components (i.e., implemented "in the cloud") whereas lower layer functionality (e.g., layer 1 and possibly some of layer 2 of the protocol stack) may be implemented in the radio unit(s) 46 and possibly the control system 38.

In some embodiments, a computer program including instructions which, when executed by the at least one processor 40, 58, causes the at least one processor 40, 58 to carry out the functionality of the network node 36 or a processing node 54 according to any of the embodiments described herein is provided. In some embodiments, a carrier containing the aforementioned computer program product is provided. The carrier is one of an electronic signal, an optical signal, a radio signal, or a computer readable storage medium (e.g., a non-transitory computer readable medium such as the memory 60).

Figure 17:
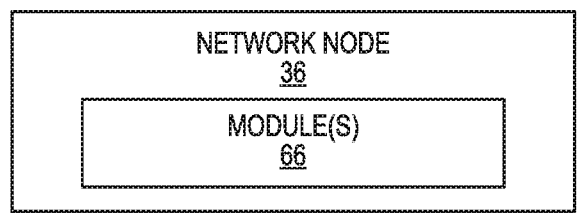

FIG. 17 is a schematic block diagram of the network node 36 (e.g., the radio access node 14) according to some other embodiments of the present disclosure. The network node 36 includes one or more modules 66, each of which is implemented in software. The module(s) 66 provide the functionality of the network node 36 described herein.

Example Embodiments

While not being limited thereto, some example embodiments of the present disclosure are provided below.

Embodiment 1

A method of operation of a receiving node to perform polar decoding, comprising: transforming (100) a code bit vector $y_N$ in accordance with a transformation $T_N$ to thereby provide a transformed code bit vector $y_N' = y_N T_N$; performing (102) polar decoding of the transformed code bit vector $y_N'$ to thereby provide a transformed data bit vector $v_N'$; and inversely transforming (104) the transformed data bit vector $v_N'$ in accordance with an inverse transformation $T_N^{-1}$ to thereby provide an estimated data bit vector $v_N = v_N' T_N^{-1}$.

Embodiment 2

The method of embodiment 1 wherein the transformation $T_N$ satisfies:

$$G_N = T_N G_N T_N^{-1}$$

where $G_N$ is a polar generating matrix of length N.

Embodiment 3

The method of embodiment 2 wherein the transformation $T_N$ is a bit-reversal matrix $R_N$ that performs permutation in such a way that $e_i R_N = e_{r(i)}$, for all $i \in \{0, 1, 2, \ldots, N-1\}$, where $e_i$ denotes a vector with all zeros except at the ith position where the element is one, and where $r(i) \in \{0, 1, 2, \ldots, N-1\}$ denotes a number whose binary representation is in a reversed bit order as the binary representation of the number i.

Embodiment 4

The method of embodiment 2 wherein the transformation $T_N$ is a last-to-first permutation matrix $F_N$ of the following form:

$$F_N = \left[ I_{N/2} \otimes \begin{bmatrix} 1 \\ 0 \end{bmatrix} \middle| I_{N/2} \otimes \begin{bmatrix} 0 \\ 1 \end{bmatrix} \right]$$

where $I_{N/2}$ is the (N/2)×(N/2) identity matrix.

Embodiment 5

The method of embodiment 2 wherein the transformation $T_N$ is an any-bit-to-any-bit permutation matrix $A_{M,N}$ of the following form:

$$A_{M,N} = F_M \otimes I_{\frac{N}{M}}$$

for any M that is a power of 2 and is no larger than N.

Embodiment 6

The method of embodiment 2 wherein the transformation $T_N$ is an arbitrary bit permutation matrix $S_{\mu,N}$ of the following form:

$$S_{\mu,N} \triangleq A_{M_1,N} A_{M_1,N} A_{M_2,N} \ldots A_{M_{\log_2 N},N} \text{ where } \{M_{i,N}\}_{i=1}^{\log_2 N}$$

where $\{M_{i,N}\}_{i=1}^{log_2 N}$ can be chosen one-by-one such that the μ(i)-th bit is in the i-th position in the final permuted binary representation.

Embodiment 7

The method of any one of embodiments 1 to 6 wherein performing (102) polar decoding of the transformed code bit vector $y_N'$ comprises performing (102) successive cancellation decoding of the transformed code bit vector $y_N'$ to thereby provide the transformed data bit vector $v_N'$.

Embodiment 8

The method of any one of embodiments 1 to 6 wherein performing (102) polar decoding of the transformed code bit vector $y_N'$ comprises performing (102) successive cancellation list decoding of the transformed code bit vector $y_N'$ to thereby provide the transformed data bit vector $v_N'$.

Embodiment 9

The method of any one of embodiments 1 to 8 wherein the code bit vector $y_N$ is a vector of Log-Likelihood Ratios, LLRs.

Embodiment 10

The method of any one of embodiments 1 to 9 further comprising extracting (106) information bits, as opposed to frozen bits, from the estimated data bit vector $v_N$.

Embodiment 11

The method of any one of embodiments 1 to 10 further comprising performing the steps of transforming (100), decoding (102), and inversely transforming (104) for each of a plurality of independent component polar codes having respective lengths that are less than N according to a prefix-free code $C=\{b_1, b_2, \ldots, b_Q\}$ of which each codeword $b_i$ has a maximum length of N bits, where Q is an integer no larger than $(log_2 N)-2$, and wherein a prefix-free code is a code where no codeword is a prefix of another codeword.

Embodiment 12

The method of embodiment 11 wherein the transformation $T_N$ is not the same for all of the plurality of independent component polar codes.

Embodiment 13

The method of any one of embodiments 1 to 10 further comprising performing the steps of transforming (100), decoding (102), and inversely transforming (104) for each of a plurality of different transformations $T_N$.

Embodiment 14

The method of embodiment 13 further comprising selecting a best estimated data bit vector $v_N$ from among the plurality of estimated data bit vectors $v_N$ output based on the plurality of different transformations $T_N$ as a final output.

Embodiment 15

The method of embodiment 13 wherein selecting the best estimated data bit vector $v_N$ comprises selecting the best estimated data bit vector $v_N$ from among the plurality of estimated data bit vectors $v_N$ output based on the plurality of different transformations $T_N$ based on one or more criteria comprising at least one of a path metric magnitude, a Cyclic Redundancy Check, CRC, checksum, and a parity-checksum.

Embodiment 16

The method of any one of embodiments 1 to 10 further comprising performing the steps of transforming (100), decoding (102), and inversely transforming (104) for each of a plurality of independent component polar codes having respective lengths that are less than N according to a code $C=\{b_1, b_2, \ldots, b_Q\}$ of which each codeword $b_i$ has a maximum length of N bits, where Q is an integer no larger than $(log_2 N)-2$.

Embodiment 17

The method of embodiment 16 wherein the transformation $T_N$ is not the same for all of the plurality of independent component polar codes.

Embodiment 18

A receiving node operable to perform polar decoding, the receiving node adapted to perform the method of any one of embodiments 1 to 17.

Embodiment 19

A receiving node operable to perform polar decoding, comprising: at least one receiver; and processing circuitry adapted to perform the method of any one of embodiments 1 to 17.

Embodiment 20

A receiving node operable to perform polar decoding, comprising: one or more modules operable to perform the method of any one of embodiments 1 to 17.

Embodiment 21

A computer program comprising instructions which, when executed on at least one processor, cause the at least one processor to carry out the method according to any one of embodiments 1 to 17.

Embodiment 22

A carrier containing the computer program of embodiment 21, wherein the carrier is one of an electronic signal, an optical signal, a radio signal, or a computer readable storage medium.

Embodiment 23

A method of decoding for polar code that is based on self-linear transformation (termed transformed successive cancellation (list) decoding), comprising: transforming the input vector of Log-Likelihood Ratios, LLRs, of the coded bits; performing conventional successive cancellation (list) decoding based on natural ordering of bit indices; inversely transforming the decoded information/frozen bit vector; and extracting the output information bit vector according to the original information set. As will be appreciated by one of ordinary skill in the art, the original information set is the set of indices of non-frozen (or information) bits, which defines which of the bit-channels are used to carry data (i.e., information bits) and which of the bit-channels are fixed to a known bit value (i.e., frozen bits), when there is no transformation.

Embodiment 24

A method of decoding for polar code that is based on self-linear transformation, comprising: determining a prefix-free code; and performing the transformed successive cancellation (list) decoding according to embodiment 23 in each subtree denoted by a codeword of the prefix-free code.

The following acronyms are used throughout this disclosure.
3GPP Third Generation Partnership Project
5G Fifth Generation
ASIC Application Specific Integrated Circuit
CPU Central Processing Unit
CRC Cyclic Redundancy Check
DSP Digital Signal Processor
eNB Enhanced or Evolved Node B
FPGA Field Programmable Gate Array
gNB New Radio Base Station
LDPC Low-Density Parity-Check
LLR Log-Likelihood Ratio
LSB Least-Significant Bit
LTE Long Term Evolution
ML Maximum-Likelihood
MME Mobility Management Entity
MSB Most Significant Bit
P-GW Packet Data Network Gateway
NR New Radio
SC Successive Cancellation
SCEF Service Capability Exposure Function
SCL List decoding of Successive Cancellation
S-GW Serving Gateway
TSC Transformed Successive Cancellation
UE User Equipment Those skilled in the art will recognize improvements and modifications to the embodiments of the present disclosure. All such improvements and modifications are considered within the scope of the concepts disclosed herein.

REFERENCE LIST

[1] E. Arikan, "Channel Polarization: A Method for Constructing Capacity-Achieving Codes for Symmetric Binary-Input Memoryless Channels," IEEE Transactions on Information Theory, vol. 55, pp. 3051-3073, July 2009.
[2] I. Tal and A. Vardy, "List Decoding of polar codes," in Proceedings of IEEE Symp. Inf. Theory, pp. 1-5, 2011.
[3] G. Sarkis P. Giard, A. Vardy, C. Thibeault, and W. J. Gross., "Fast Polar Decoders: Algorithm and Implementation," IEEE Journal on Selected Areas in Communications, VOL. 32, pp. 946-957, May, 2014.

What is claimed is:

1. A method of operation of a receiving node to perform polar decoding, comprising:
transforming a received code bit vector $y_N$ in accordance with a transformation $T_N$ to thereby provide a transformed code bit vector $y'_N = y_N T_N$;
performing polar decoding of the transformed code bit vector $y'_N$ to thereby provide a transformed data bit vector $v'_N$; and
inversely transforming the transformed data bit vector $v'_N$ in accordance with an inverse transformation $T_N^{-1}$ to thereby provide an estimated data bit vector $v_N = v'_N T_N^{-1}$.

2. The method of claim 1 wherein the transformation $T_N$ satisfies:

$$G_N T_N G_N T_N^{-1}$$

where $G_N$ is a polar generating matrix of length N.

3. The method of claim 2 wherein the transformation $T_N$ is a bit-reversal matrix $R_N$ that performs permutation in such a way that $e_i R_N = e_{r(i)}$, for all $i \in \{0, 1, 2, \ldots, N-1\}$, where $e_i$ denotes a vector with all zeros except at the ith position where the element is one, and where $r(i) \in \{0, 1, 2, \ldots, N-1\}$ denotes a number whose binary representation is in a reversed bit order as the binary representation of the number i.

4. The method of claim 2 wherein the transformation $T_N$ is a bit-reversal matrix $R_N$ that performs permutation in such a way that an order of the bits in a binary representation of indices that address elements in the received code bit vector $y_N$ is reversed to provide the transformed code bit vector $y'_N$.

5. The method of claim 2 wherein the transformation $T_N$ is a last-to-first permutation matrix $F_N$ of the following form:

$$F_N = \left[ I_{N/2} \otimes \begin{bmatrix} 1 \\ 0 \end{bmatrix} \middle| I_{N/2} \otimes \begin{bmatrix} 0 \\ 1 \end{bmatrix} \right]$$

where $I_{N/2}$ is the (N/2)×(N/2) identity matrix.

6. The method of claim 2 wherein the transformation $T_N$ is a last-to-first permutation matrix $F_N$ that performs permutation in such a way that a last bit in a binary representation of indices that address elements of the received code bit vector $y_N$ becomes a first bit in a binary representation of indices that address elements of the transformed code bit vector $y'_N$.

7. The method of claim 2 wherein the transformation $T_N$ is an any-bit-to-any-bit permutation matrix $A_{M,N}$ of the following form:

$$A_{M,N} = F_M \otimes I_{\frac{N}{M}}$$

for any M that is a power of 2 and is no larger than N.

8. The method of claim 2 wherein the transformation $T_N$ is an any-bit-to-any-bit permutation matrix $A_{M,N}$ that performs permutation in such a way that a bit at a first bit location in a binary representation of indices that address elements of the received code bit vector $y_N$ becomes a bit at a second bit location in a binary representation of indices that address elements of the transformed code bit vector $y'_N$, wherein the first bit location is different than the second bit location.

9. The method of claim 2 wherein the transformation $T_N$ is an arbitrary bit permutation matrix $S_{\mu,N}$ of the following form:

$$S_{\mu,N} \triangleq A_{M_1,N} A_{M_1,N} A_{M_2,N} \cdots A_{M_{log_2 N},N} \text{ where } \{M_{i,N}\}_{i=1}^{log_2 N}$$

can be chosen one-by-one such that the $\mu(i)$-th bit is in the i-th position in the final permuted binary representation.

10. The method of claim 2 wherein the transformation $T_N$ is an arbitrary bit permutation matrix $S_{\mu,N}$ that performs multiple any-bit-to-most-significant bit permutations on bits in a binary representation of indices that address elements of the received code bit vector $y_N$ to provide the transformed code bit vector $y'_N$.

11. The method of claim 1 wherein performing polar decoding of the transformed code bit vector $y'_N$ comprises performing successive cancellation decoding of the transformed code bit vector $y'_N$ to thereby provide the transformed data bit vector $v'_N$.

12. The method of claim 1 wherein performing polar decoding of the transformed code bit vector $y'_N$ comprises performing successive cancellation list decoding of the transformed code bit vector $y'_N$ to thereby provide the transformed data bit vector $v'_N$.

13. The method of claim 1 wherein the received code bit vector $y_N$ is a vector of Log-Likelihood Ratios, LLRs.

14. The method of claim 13 wherein:
  transforming the received code bit vector $y_N$ in accordance with the transformation $T_N$ comprises transforming the vector of LLRs in accordance with the transformation $T_N$ to thereby provide the transformed data bit vector $v'_N$; and
  performing polar decoding of the transformed code bit vector $y'_N$ comprises performing successive cancellation or successive cancellation list decoding of the transformed code bit vector $y'_N$ based on a natural ordering of bit indices for the transformed code bit vector $y'_N$ to thereby provide the transformed data bit vector $v'_N$.

15. The method of claim 14 further comprising extracting an output information bit vector from the transformed data bit vector $v'_N$ according to an original information set for the received code bit vector $y_N$, the original information set for the received code bit vector $y_N$ defining which bits of the received code bit vector $y_N$ are information bits and which bits of the received code bit vector $y_N$ are frozen bits.

16. The method of claim 1 further comprising extracting information bits, as opposed to frozen bits, from the estimated data bit vector $v_N$.

17. The method of claim 1 further comprising performing the steps of transforming, decoding, and inversely transforming for each of a plurality of independent component polar codes having respective lengths that are less than N according to a prefix-free code $C=\{b_1, b_2, \ldots, b_Q\}$ of which each codeword $b_i$ has a maximum length of N bits, where Q is an integer no larger than $(\log_2 N)-2$, and wherein a prefix-free code is a code where no codeword is a prefix of another codeword.

18. The method of claim 17 wherein the transformation $T_N$ is not the same for all of the plurality of independent component polar codes.

19. The method of claim 1 further comprising performing the steps of transforming, decoding, and inversely transforming for each of a plurality of different transformations $T_N$ to thereby provide a plurality of estimated data bit vectors.

20. The method of claim 19 further comprising selecting a best estimated data bit vector from among the plurality of estimated data bit vectors output based on the plurality of different transformations $T_N$ as a final estimated data bit vector.

21. The method of claim 20 wherein selecting the best estimated data bit vector comprises selecting the best estimated data bit vector from among the plurality of estimated data bit vectors output based on the plurality of different transformations $T_N$ based on one or more criteria comprising at least one of a path metric magnitude, a Cyclic Redundancy Check, CRC, checksum, and a parity-checksum.

22. The method of claim 1 further comprising performing the steps of transforming, decoding, and inversely transforming for each of a plurality of independent component polar codes having respective lengths that are less than N according to a code $C=\{b_1, b_2, \ldots, b_Q\}$ of which each codeword $b_i$ has a maximum length of N bits, where Q is an integer no larger than $(\log_2 N)-2$.

23. The method of claim 22 wherein the transformation $T_N$ is not the same for all of the plurality of independent component polar codes.

24. A receiving node operable to perform polar decoding, comprising:
  at least one receiver; and
  processing circuitry adapted to:
    transform a received code bit vector $y_N$ in accordance with a transformation $T_N$ to thereby provide a transformed code bit vector $y'_N=y_N T_N$;
    perform polar decoding of the transformed code bit vector $y'_N$ to thereby provide a transformed data bit vector $v'_N$; and
    inversely transform the transformed data bit vector $v'_N$ in accordance with an inverse transformation $T_N^{-1}$ to thereby provide an estimated data bit vector $v_N=v'_N T_N^{-1}$.

25. A method of operation of a transmitting node to perform polar encoding, comprising:
  transforming a data bit vector $u_N$ in accordance with a transformation $T_N$ to thereby provide a transformed data bit vector $u'_N=u_N T_N$;
  performing polar encoding of the transformed data bit vector $u'_N$ to thereby provide a transformed code bit vector $x'_N$; and
  inversely transforming the transformed code bit vector $x'_N$ in accordance with an inverse transformation $T_N^{-1}$ to thereby provide a code bit vector $x_N=x'_N T_N^{-1}$.

* * * * *